US010905035B2

(12) United States Patent
Whitehead et al.

(10) Patent No.: US 10,905,035 B2
(45) Date of Patent: Jan. 26, 2021

(54) CROSSFLOW HEAT-EXCHANGERS

(71) Applicant: AMSCREEN GROUP LIMITED, Lancashire (GB)

(72) Inventors: Stephen Whitehead, Edgworth Bolton (GB); Jonathan Shires, Horwich Bolton (GB); Gary Greenwood, Horwich Bolton (GB); Peter Francis, Stoke on Trent (GB)

(73) Assignee: AMSCREEN GROUP LIMITED, Lancashire (GB)

( * ) Notice: Subject to any disclaimer, the term of this patent is extended or adjusted under 35 U.S.C. 154(b) by 0 days.

(21) Appl. No.: 16/499,672

(22) PCT Filed: Apr. 30, 2018

(86) PCT No.: PCT/GB2018/051148
§ 371 (c)(1),
(2) Date: Sep. 30, 2019

(87) PCT Pub. No.: WO2018/197906
PCT Pub. Date: Nov. 1, 2018

(65) Prior Publication Data
US 2020/0128701 A1  Apr. 23, 2020

(30) Foreign Application Priority Data
Apr. 28, 2017 (GB) .................................. 1706765.3

(51) Int. Cl.
| H05K 7/20 | (2006.01) |
| G02F 1/1333 | (2006.01) |
| F28D 9/00 | (2006.01) |

(52) U.S. Cl.
CPC ....... *H05K 7/20972* (2013.01); *F28D 9/0037* (2013.01); *G02F 1/133385* (2013.01);
(Continued)

(58) Field of Classification Search
CPC .... H05K 7/202; H05K 7/20209; H05K 7/206; H05K 7/20972; F28D 9/0037
See application file for complete search history.

(56) References Cited

U.S. PATENT DOCUMENTS

| 5,054,545 A | * | 10/1991 | Ghaemian | ............... | F28F 3/025 165/104.33 |
| 5,934,368 A | | 8/1999 | Tanaka et al. | | |

(Continued)

FOREIGN PATENT DOCUMENTS

| CN | 109059589 A | * 12/2018 |
| EP | 2801888 A2 | 11/2014 |

(Continued)

OTHER PUBLICATIONS

International Search Report dated Oct. 9, 2018 for PCT/GB2018/051148.

(Continued)

*Primary Examiner* — Robert J Hoffberg
(74) *Attorney, Agent, or Firm* — Christopher M. Ramsey; GrayRobinson, P.A.

(57) ABSTRACT

A crossflow heat-exchanger has first and second sets of fluid-flow channels arranged such that each set crosses the other to afford heat-exchange between cooling air in the first set and hot air in the second set, without the cooling air and the hot air contacting one another. A first series of fans causes flow of the external cooling air through the rows. A second series of fans causes flow of the internal hot air through the columns. External and internal fan controllers control the speed of each fan independently such that external cooling air flows through different rows at different rates and internal hot air flows through different columns at different rates.

30 Claims, 17 Drawing Sheets

(52) U.S. Cl.
CPC ......... *H05K 7/202* (2013.01); *H05K 7/20145* (2013.01); *H05K 7/20172* (2013.01); *H05K 7/20209* (2013.01); *H05K 7/20518* (2013.01); *G02F 2201/36* (2013.01)

(56) References Cited

U.S. PATENT DOCUMENTS

| | | | | |
|---|---|---|---|---|
| 6,401,802 | B2* | 6/2002 | Cottingham | F24F 12/006 |
| | | | | 165/54 |
| 7,174,741 | B2* | 2/2007 | Lee | F24F 1/022 |
| | | | | 165/149 |
| 7,508,663 | B2* | 3/2009 | Coglitore | H05K 7/20736 |
| | | | | 165/122 |
| 8,351,014 | B2* | 1/2013 | Dunn | F21V 29/67 |
| | | | | 349/161 |
| 8,654,302 | B2* | 2/2014 | Dunn | H05K 7/20972 |
| | | | | 349/161 |
| 9,030,641 | B2* | 5/2015 | Dunn | F21V 29/67 |
| | | | | 349/161 |
| 9,075,262 | B2* | 7/2015 | Cho | G02F 1/133385 |
| 9,119,325 | B2* | 8/2015 | Dunn | H05K 7/20163 |
| 9,173,325 | B2* | 10/2015 | Dunn | H05K 7/20154 |
| 9,801,305 | B2* | 10/2017 | Dunn | H05K 7/20163 |
| 9,835,893 | B2* | 12/2017 | Dunn | H05K 7/20154 |
| 9,901,015 | B2* | 2/2018 | Lin | H05K 7/20972 |
| 10,018,866 | B2* | 7/2018 | Cho | G02F 1/133528 |
| 10,180,591 | B2* | 1/2019 | Lee | H05K 7/20972 |
| 10,506,740 | B2* | 12/2019 | Dunn | H05K 7/202 |
| 10,624,218 | B2* | 4/2020 | Dunn | H05K 7/20954 |
| 10,721,836 | B2* | 7/2020 | Dunn | G02F 1/133385 |
| 2001/0052412 | A1 | 12/2001 | Tikka | |
| 2009/0056348 | A1 | 3/2009 | Noll et al. | |
| 2010/0182562 | A1 | 7/2010 | Yoshida et al. | |
| 2011/0013114 | A1 | 1/2011 | Dunn et al. | |
| 2011/0085301 | A1 | 4/2011 | Dunn | |
| 2011/0261523 | A1 | 10/2011 | Dunn et al. | |
| 2012/0012300 | A1 | 1/2012 | Dunn et al. | |
| 2012/0105790 | A1 | 5/2012 | Hubbard | |
| 2012/0223877 | A1 | 9/2012 | Cho | |
| 2012/0249402 | A1 | 10/2012 | Kang | |
| 2012/0255721 | A1 | 10/2012 | Kim et al. | |
| 2013/0227976 | A1 | 9/2013 | Yamashita | |
| 2015/0009627 | A1 | 1/2015 | Dunn et al. | |
| 2015/0075758 | A1 | 3/2015 | Ishimaru et al. | |
| 2015/0237761 | A1 | 8/2015 | Dunn | |
| 2016/0198588 | A1 | 7/2016 | DeMars | |
| 2016/0242329 | A1 | 8/2016 | DeMars | |
| 2017/0172016 | A1 | 6/2017 | Kang | |
| 2018/0020579 | A1* | 1/2018 | Chang | H05K 7/20154 |
| 2018/0310439 | A1 | 10/2018 | Oh et al. | |
| 2018/0317350 | A1 | 11/2018 | Dunn et al. | |
| 2019/0289754 | A1 | 9/2019 | Hubbard | |

FOREIGN PATENT DOCUMENTS

| | | |
|---|---|---|
| JP | 2011150034 A | 8/2011 |
| WO | 2010080624 A3 | 9/2010 |
| WO | 2012090548 A1 | 7/2012 |

OTHER PUBLICATIONS

UK Search Report dated Oct. 13, 2017 for GB1706765.3.
Office Action dated Nov. 3, 2020 for U.S. Appl. No. 16/499,962.
Office Action dated Nov. 5, 2020 for U.S. Appl. No. 16/499,947.

* cited by examiner

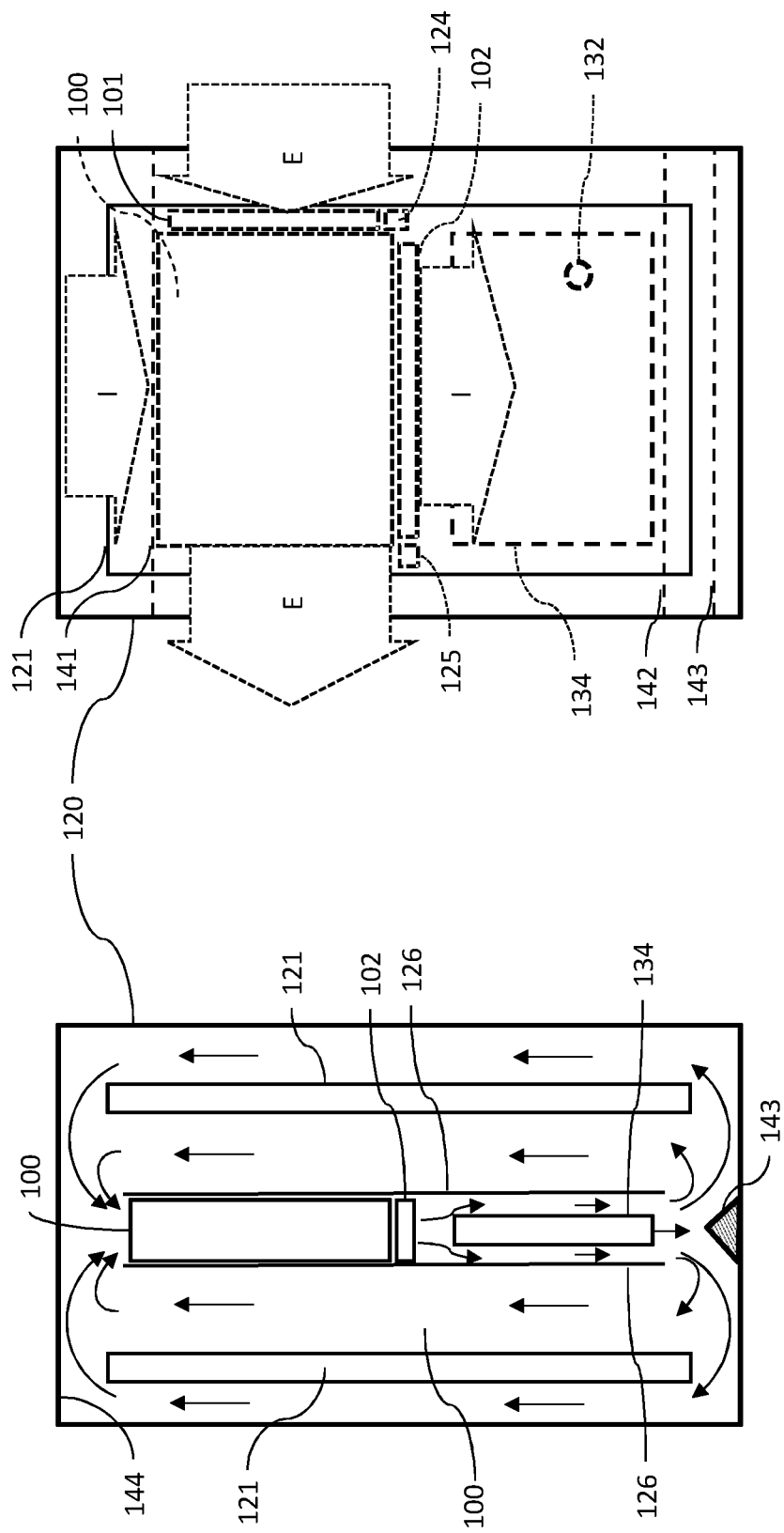

CROSSFLOW HEAT-EXCHANGERS

CROSS-REFERENCE TO RELATED APPLICATIONS

This is the U.S. National Stage application of International Application No. PCT/GB2018/051148, filed Apr. 30, 2018, which claims the benefit of priority from GB Application No. 1706765.3, filed Apr. 28, 2017. The entire contents of these prior applications are incorporated by reference herein.

FIELD

The present invention relates to crossflow heat-exchangers. It is concerned particularly, although not exclusively, with large-scale electronic displays that incorporate crossflow heat-exchangers. In the context of this specification, "large-scale" means a minimum visible screen size of approximately 50 inches (127 cm), measured diagonally across the screen.

BACKGROUND

Electronic advertising displays are being used increasingly. They are used in outdoor as well as indoor venues; in locations such as traditional roadside and city centre billboard locations, travel environments (e.g. rail platforms, airports, bus stops, trams, underground rail), retail environments (e.g. shopping malls, supermarkets, petrol stations), entertainment venues (e.g. stadiums, arenas, cinemas, restaurants, bars) and typically any location where advertisers can reach large audiences as they go about their day to day business.

Such displays typically use LCD or LED technology and are designed to cater for outdoor environmental conditions such as weather, temperature, water, wind loading, etc and are designed to withstand robust environments e.g. vandalism and accidental impacts e.g. from vehicles, shopping trolleys, people, etc.

Such displays are typically large—e.g. high brightness 70 inches (178 cm) or more visible screens that can be viewed by a mass audience from a distance and require varied fixing mechanisms to suit the varied application needs—e.g. ground fixed (with suitable foundations), wall mounted, integrated with structures e.g. bus-stops—and often with some creative or branded design to suit the marketing needs of brand, retailer or display owner.

Such displays are typically heavy, incorporating a substantial chassis with high thermal mass. Changes in ambient conditions, such as temperature and humidity, can lead to unwanted condensation that can be a danger to electronics within the display. This can be a particular problem when the display is started up after being idle overnight, when the ambient temperature may have dropped considerably. Whilst displays often incorporate a heat-exchanger as part of a cooling system, to prevent the display from overheating in warm or sunny conditions, the heat-exchanger may contribute to condensation problems upon start-up of the display, or due to unfavourable ambient conditions whilst the display is running. It is common for heat-exchangers to have cold spots, where condensation may tend to form.

BRIEF SUMMARY

Preferred embodiments of the present invention aim to provide large-scale electronic displays that are improved in this respect. However, the invention has more general application to heat-exchangers in other applications.

In the context of this specification, the term 'heat-exchanger' means a device or an arrangement of components that provides heat exchange between two fluids, whilst preventing direct contact between the fluids. A heat-exchanger may be a dedicated device. Alternatively, heat exchange functionality may be provided by an arrangement of components in an apparatus—for example, an electronic display. In an electronic display, heat-exchange function may be provided in different areas—for example, adjacent the front or back of one or more display panel, adjacent an electronic control assembly, and so on. Such heat-exchange functions may be provided as parts of a common heat-exchanger or as individual heat-exchangers.

According to one aspect of the present invention, there is provided a crossflow heat-exchanger comprising:

first and second sets of fluid-flow channels arranged such that each set crosses the other to afford heat-exchange between a first fluid in the first set and a second fluid in the second set, without the first and second fluids contacting one another;

a first impelling means arranged to cause flow of the first fluid through the first set of channels;

a second impelling means arranged to cause flow of the second fluid through the second set of channels; and a first controller for the first impelling means and arranged, in use, to control the flow of fluid through the first set of channels such that fluid flows through different channels of the first set at different rates.

Preferably, such a crossflow heat-exchanger further comprises a second controller for the second impelling means and arranged to control the flow of fluid through the second set of channels such that fluid flows through different channels of the set at different rates.

Preferably, in use, the flow rates in the different channels of the first and/or second set decrease from one side of the set to an opposite side of the same set.

Preferably, said one side of the first and/or second set is adjacent a fluid input to the other set.

Preferably, said first and/or second impelling means is disposed at the output side of the respective set of channels.

Preferably, said first and/or second impelling means comprises a plurality of impellers for the respective set of channels.

Preferably, the respective said controller is arranged to control the speeds of the impellers, to control the respective fluid flow rates.

Preferably, said first and/or second impelling means comprises a respective impeller for each channel of the respective set of channels.

Preferably, each impeller is individually controlled by the respective first or second controller.

Preferably, said first and/or second impelling means comprises at least one impeller arranged to impel the fluid through a plurality of channels of the respective set; and the respective controller comprises one or more controllable restrictor arranged to restrict the flow of fluid through respective ones of said plurality of channels.

Preferably, said first and/or second controller responds to temperature sensors on or adjacent to the respective set of channels.

Preferably, said first and second sets of channels cross one another substantially at right angles.

Preferably, said first and/or second controller control(s) the flow of fluid through the respective channels to tend to maximise temperature differentials between the first and second fluids, at or around intersection points of said first and second sets of channels.

A crossflow heat-exchanger as above may be disposed within a housing in which one of the first and second fluids circulates, and the other of the first and second fluids is introduced from outside the housing.

A crossflow heat-exchanger as above may be arranged to operate with gases as said first and second fluids.

An electronic display may comprise a crossflow heat-exchanger as above, said gases comprise air and the heat-exchanger is arranged to provide cooling of internal air circulating within the housing by external air introduced from outside the housing.

Such an electronic display may be a large-scale electronic display.

According to another aspect of the present invention, there is provided a method of operating a crossflow heat-exchanger or an electronic display according to any of the preceding aspects of the invention, comprising the steps of causing flow of the first and second fluids through the first and second sets of channels and controlling the flow of fluid through the channels such that fluid flows through different channels at different rates.

The invention extends to an electronic apparatus comprising a heat exchanger or electronic display according to any of the preceding aspects of the invention and comprising a housing and, disposed within the housing:

a power supply unit arranged to receive electrical power from an external source and supply electrical power to components of the electronic apparatus;

a power controller arranged to control the power supply unit;

a heat source;

temperature sensing means;

humidity sensing means; and an electronic processor arranged to receive power from the power supply unit and to carry out functions of the electronic apparatus:

wherein, upon startup of the electronic apparatus, the power controller is arranged to:

receive temperature and humidity data from the temperature and humidity sensing means;

process the received temperature and humidity data to indicate a current dew point within the housing;

compare the current dew point with a current location temperature at a location within the housing;

if the current location temperature is at or below the current dew point, activate the heat source to raise the temperature within the housing; and only if the current location temperature is above the current dew point, supply electrical power from the power supply unit to the electronic processor.

Such an electronic apparatus may further comprise a dehumidifier, wherein the electronic processor is arranged to control the dehumidifier in order to adjust dew point within the housing.

Preferably, in use, after the power controller has supplied electrical power to the electronic processor, the electronic processor takes over the monitoring of data from the temperature sensing means and the humidity sensing means and controls operation of the heater, and dehumidifier if present, in response to that monitored data.

Preferably, the power controller is hardened to be resistant to moisture.

The invention extends to an electronic apparatus comprising a heat-exchanger, electronic display or electronic apparatus according to any of the preceding aspects of the invention, the apparatus comprising a housing and, disposed within the housing:

a heat-exchanger arranged to exchange heat between internal and external fluids without direct contact between the internal and external fluids, the internal fluid circulating within the housing and the external fluid being received from externally of the housing and output to externally of the housing;

a heat source;

impellers for impelling said fluids through the heat-exchanger;

a controller for controlling the heat source and the flow of fluids through the heat-exchanger;

temperature sensing means; and humidity sensing means:

wherein the controller is arranged to:

receive temperature and humidity data from the temperature and humidity sensing means;

process the received temperature and humidity data to indicate a current dew point within the housing;

compare the current dew point with a current location temperature at a location within the housing; and if the current location temperature is at or below the current dew point, control the flow of fluids through the heat-exchanger to raise the temperature at at least one location on the heat-exchanger and/or activate the heat source to raise the temperature within the housing.

The invention extends to an electronic display comprising a heat-exchanger, electronic display or electronic apparatus according to any of the preceding aspects of the invention, the electronic display comprising:

a housing that is divided internally into regions;

a display panel within one of said regions and having a display surface that is visible through the housing; and a cooling module disposed within the housing and arranged to provide a flow of internal coolant through the cooling module and said regions:

wherein each of said regions and said cooling module has a respective internal coolant inlet and internal coolant outlet;

the internal coolant inlets of said regions communicate with the internal coolant outlet of the cooling module and the internal coolant outlets of said regions communicate with the internal coolant inlet of the cooling module;

the arrangement is such that each of said regions has its own circulating loop of internal coolant, through the respective said region and the cooling module; and the flow of internal coolant passes over both front and back of the or each respective display panel.

Preferably, the cooling module has side walls that extend between side walls of the housing.

Preferably, the side walls of the cooling module divide the housing into said regions.

Preferably, the internal coolant inlet and internal outlet of the cooling module face and are spaced from side walls of the housing.

The invention extends to an electronic display comprising a heat-exchanger, electronic display or electronic apparatus according to any of the preceding aspects of the invention, the electronic display comprising:

a housing;

a display panel within the housing and having a display surface that is visible through the housing;

an electronic processor arranged to control functions of the display and operating conditions within the housing;

input sensors disposed within the housing at distributed locations and arranged to sense operating conditions within the housing;

output components disposed within the housing at distributed locations and arranged to respond to control signals; and a bus connecting said input sensors, output components and electronic processor for intercommunication:

wherein processing of signals received from said input sensors and control signals passed to the output components is distributed amongst microcontrollers that are local to said input sensors and output components and connect said input sensors and output components to said bus.

Preferably, said operating conditions comprise environmental conditions.

Preferably, said input sensors comprise humidity sensors and temperature sensors.

Preferably, said output components are operative to adjust environmental conditions.

BRIEF DESCRIPTION OF THE DRAWINGS

For a better understanding of the invention, and to show how embodiments of the same may be carried into effect, reference will now be made, by way of example, to the accompanying diagrammatic drawings, in which:

FIG. 2A is a diagrammatic side view of a large-scale electronic display with a heat-exchanger and two LCD panels arranged back-to-back;

FIG. 2B is a diagrammatic front view of the display and heat-exchanger of FIG. 2A;

DESCRIPTION OF EXAMPLE EMBODIMENTS

Figure 1:
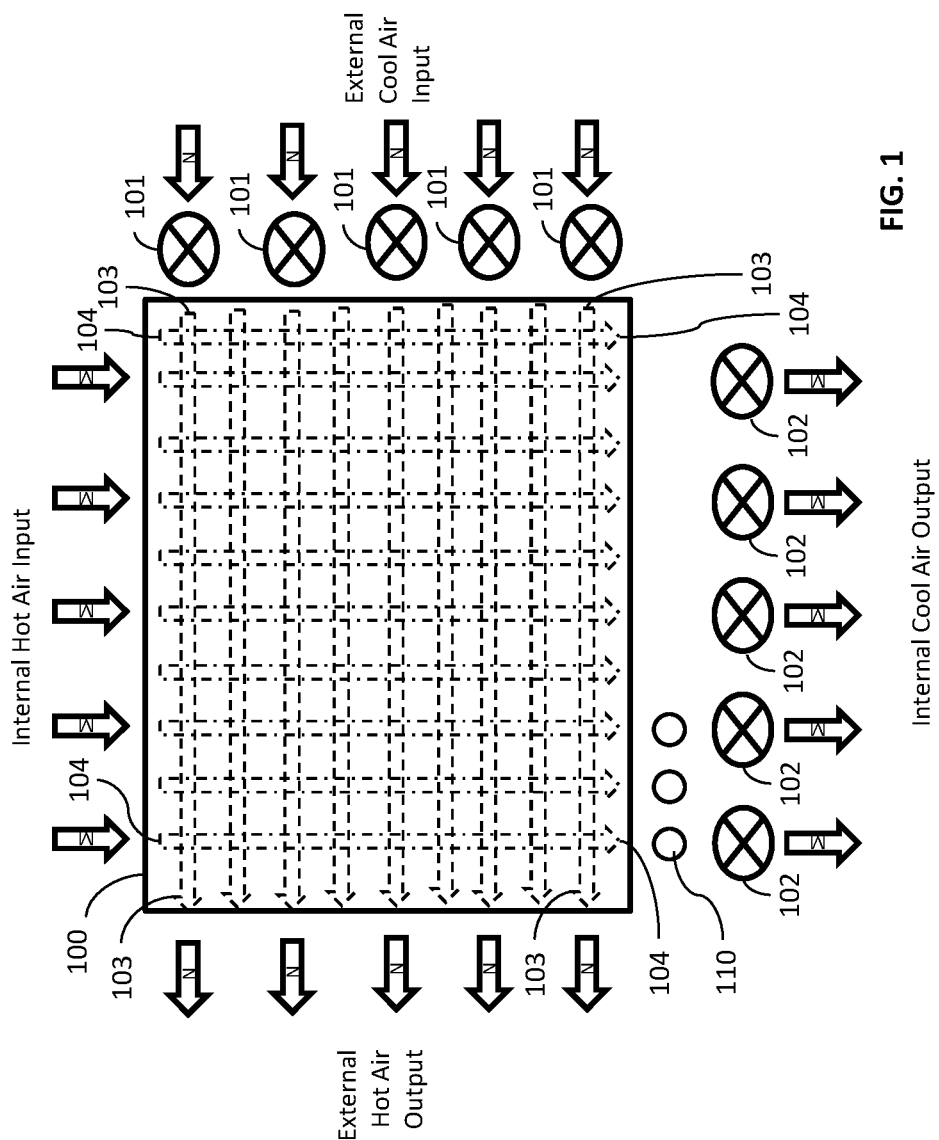
FIG. 1 shows a crossflow heat-exchanger for use in a large-scale electronic display, with uniform air flow through the heat-exchanger.

In the following description, for ease of reference, terms of position and orientation are used conveniently to denote the position and orientation of items as shown in the figures. However, it will be appreciated that such items could be disposed in other positions or orientations, and terms such as "top", "bottom", "left", "right", "vertical", "horizontal", etc. are to be construed accordingly, to include such alternative positions and orientations.

It is to be understood that the various features that are described in the following and/or illustrated in the drawings are preferred but not essential. Combinations of features described and/or illustrated are not considered to be the only possible combinations. Unless stated to the contrary, individual features may be omitted, varied or combined in different combinations, where practical.

In the figures, like references denote like or corresponding parts.

In FIG. 1, a crossflow heat-exchanger 100 has first and second sets of fluid-flow channels 103, 104 arranged such that each set crosses the other to afford heat-exchange between cooling air in the first set 103 and hot air in the second set 104, without the cooling air and the hot air contacting one another. As shown in the figure, channels 103 may be seen as rows and channels 104 may be seen as columns. In this example, the channels 103, 104 cross each other substantially at right angles—but they could cross at other angles.

Figure 2D:
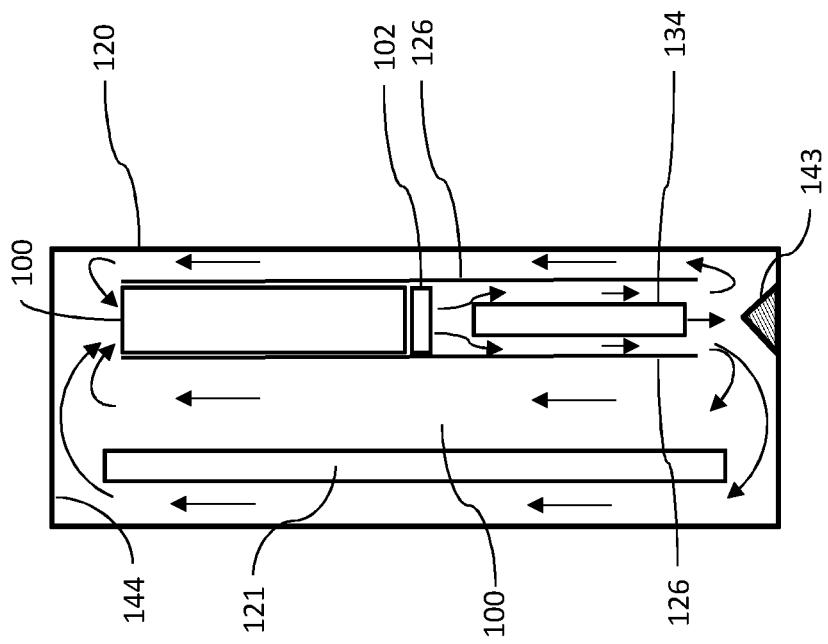
FIG. 2D is a view similar to that of FIG. 2A but with a single LCD panel.
Figure 2C:
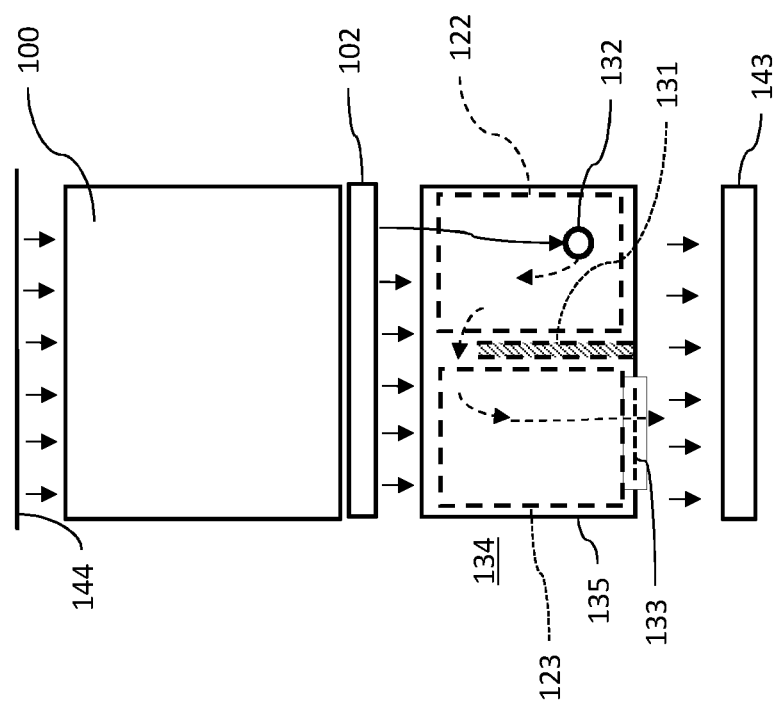
FIG. 2C is a diagrammatic front view of a heat-exchanger, internal fan array and Electronics Control Assembly as juxtaposed within the display of FIG. 2A.

In use, with reference to FIGS. 2A to 2C, the heat-exchanger 100 is located within a closed housing 120 of a large-scale electronic display that generates heat, much of which is produced by a pair of LCD panels 121 arranged in a back-to back configuration, such that the display surfaces of the LCD panels 121 face in opposite directions and are visible through suitably transparent portions of the housing 120. Each of the LCD panels 121 typically includes an LED backlight, which generates heat. Sensitive electronics 122 and power supplies 123 are housed within an Electronics Control Assembly (ECA) 134 located within the internal air path below the heat-exchanger 100. The sensitive electronics 122 may include a PC, router and sensors. External and internal fan controllers 124, 125 are provided adjacent the external airflow and internal airflow fans 101, 102 respectively.

Internal hot air flows through the columns 104 of the heat-exchanger 100 from top to bottom, indicated by arrows I in FIG. 2B, whilst external cooling air flows through the rows 103 of the heat-exchanger 100 from right to left, indicated by arrows E in FIG. 2B.

The heat-exchanger 100 together with internal airflow fans 102 and ECA 134 are located between a pair of baffles 126 that define an airflow passage to direct internal airflow within the housing 120. The baffles 126 extend the full width but not the full height of the housing 120, as shown by their upper edges 141 and lower edges 142 in FIG. 2B. Hot internal air is drawn into the top of the heat-exchanger 100, as seen in FIG. 2A, and cooled internal air exits from the bottom of the heat-exchanger 100 to flow over the ECA 134. As it exits the bottom of the airflow passage between the baffles 126, the internal air is deflected to back and front regions of the housing 120 by an inclined or curved air deflector 143 and then flows upwardly over both front and back of the respective LCD panels 121. From the top of the LCD panels 121, the heated internal air is deflected by the inner upper surface 144 of the housing 120 and is then drawn back into the top of the heat-exchanger 100, where it repeats the loops just described. An air deflector along the lines of air deflector 143 may be provided on the inner upper surface 144 of the housing 120.

As shown in FIG. 2C, the ECA 134 has its own housing 135 formed with one or more input vent 132 (in this example, in a side face of housing 135, facing a baffle 126) and one or more output vent 133 (in this example, in the bottom of housing 135). One or more fan (e.g. 208, 317 in FIGS. 9 and 11) located within the housing 135 draws cool internal air (from the heat-exchanger 100) into the ECA 134 and directs this air upward across sensitive electronics 122 within the ECA 134.

An internal baffle 131 within the ECA 134 guides internal cool air to the top of the ECA and through a gap between the baffle 131 and the top of the housing 135. This air then passes downwards (propelled by the one or more fan within the housing 135, each located adjacent a respective input vent 132) over power supply assemblies 123 to provide cooling of the power supply assemblies. Air circulating within the ECA 134 is output at the one or more output vent 133 at the base of the housing 135.

Cool internal air output from the heat-exchanger 100 (propelled by internal air circulating fans 102) therefore passes over the outside of the ECA 134 and also passes through the inside of the ECA 134 via input and output vents 132, 133. The internal air combines at the bottom of the ECA 134 for onward circulation over the front and rear of the LCD displays 121 as described above.

FIG. 2D shows a similar arrangement to FIG. 2A, but with a single LCD panel 121, over which internal air flows in a loop as described above. At the opposite side of the housing 120, the internal air flows in a similar loop that includes the space between the respective baffle 126 and opposing wall of the housing 120. This is advantageous from a mass volume production perspective, enabling single and back-to-back displays to share common design and manufacturing processes. Further designs may comprise displays with housings divided internally into more than two regions, each with or without a respective display panel, and a cooling module such as 100, 126 providing a flow of internal coolant through the cooling module and divided regions. In the example of FIGS. 2A to 2D, the baffles 126 effectively divide the housing internally into front and back regions. Alternative dividers may be employed.

Although it is advantageous for the baffles 126 to extend fully from one side to an opposite side of the housing 120, a small amount of leakage at the sides of the baffles may be permissible, provided that the main circulating loops of internal air, as described above, are maintained.

A first impelling means in the form of a series of fans 101 causes flow of the external cooling air through the rows 103. A second impelling means in the form of a series of fans 102 causes flow of the internal hot air through the columns 104. The first fans 101 are located at the input side of the rows 103. The second fans 102 are located at the output side of the columns 104. Thus, in each case, the fans 101, 102 are located at the cooler side of the heat-exchanger; this promotes a longer service life of the fans. However, the fans could be located at the other sides of the rows 103 and columns 104.

As will be known to the skilled reader, in use of the heat-exchanger, heat is exchanged between the rows 103 and the columns 104 and thus the air flowing through them, so that the flow of external cooling air provides cooling of the internal hot air, the effect of which is to raise the temperature of the external air as it passes through the rows 103.

As indicated in FIG. 1, air flow through the rows 103 is substantially constant at a rate N for each of the rows 103. Likewise, airflow through the columns 104 is substantially constant at a rate M for each of the columns 104. This is a typical arrangement for a crossflow heat-exchanger. Any suitable number of fans 101, 102 or other impellers may be provided to cause the airflow.

A potential problem with this typical arrangement is that, in use, the heat-exchanger will tend to have hot and cold spots. As the external cooling air travels from right to left, it gets progressively hotter. As the internal hot air travels from top to bottom, it gets progressively cooler. Thus, at the top left corner of the heat-exchanger, heated external air crosses hottest internal air: this is the hottest part of the heat-exchanger. The coldest part of the heat-exchanger is at the bottom right corner, where cooled internal air crosses coolest external air.

Figure 3:
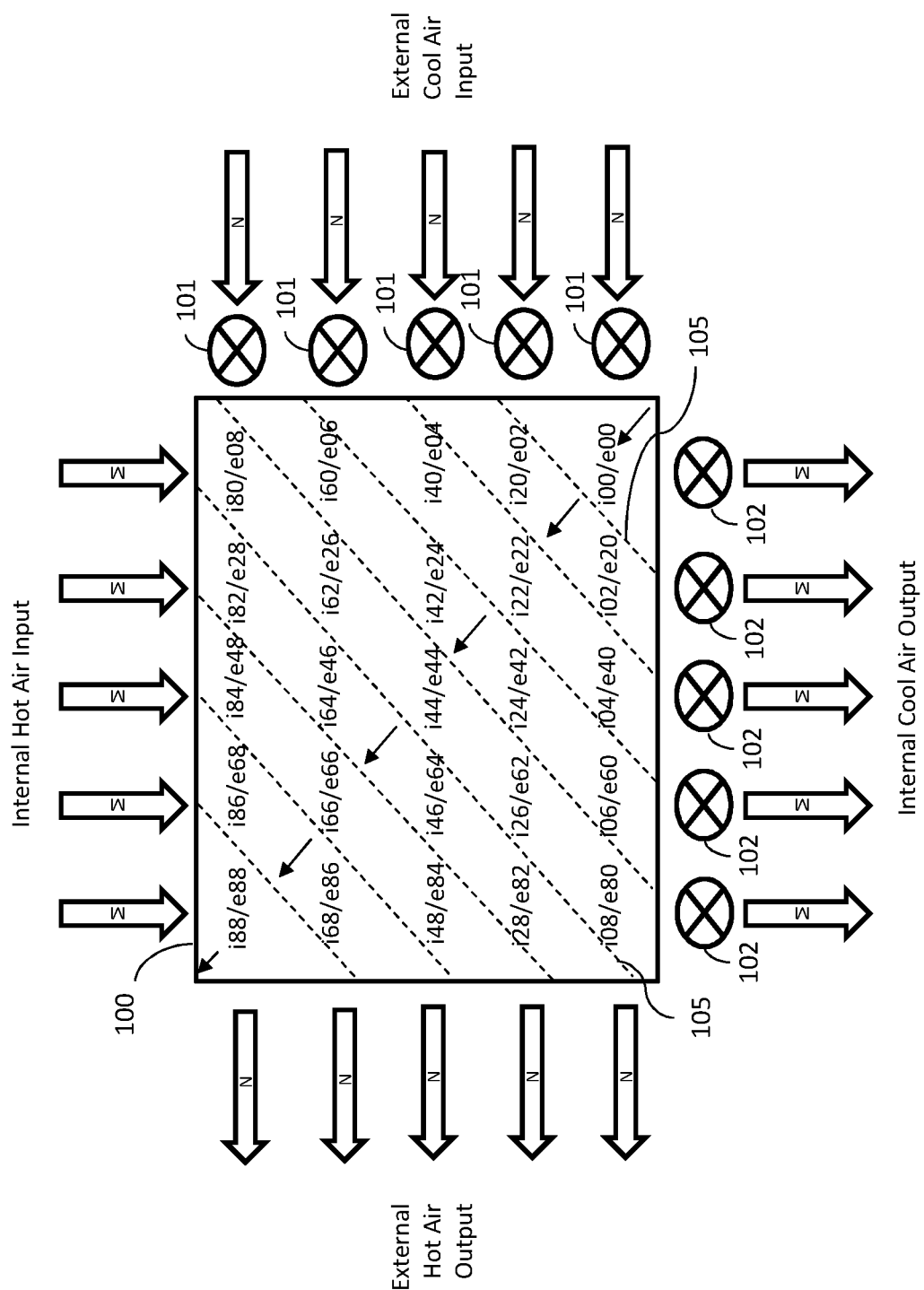
FIG. 3 is a view similar to FIG. 1, illustrating a typical heat-exchanger temperature characteristic.

FIG. 3 illustrates a temperature characteristic of a typical arrangement as above. Variables ix indicate variations of temperature of the internal air, on a notional scale of x from 0 to 100, 0 being the coldest temperature and 100 being the hottest. Variables ey indicate variations of temperature of the external air on another notional scale of y from 0 to 100, which will typically indicate different absolute temperature values to those indicated by the scale ix.

Legends ix/ey indicate internal air and external air temperatures at intersections of the rows 103 and channels 104. Thus, for example, the coldest spot at the bottom right corner gives a zero (coldest) temperature for both internal and external air—i00/e00. The highest temperatures at the top left corner are indicated by i88/e88.

Relative temperature indications such as i00/e00 and i88/e88 also indicate a relatively low temperature differential between internal and external air and therefore a relatively low rate of heat transfer. This is the case wherever x=y, as tracked in FIG. 3 by the arrows from bottom right to top left corners. Diagonal dashed lines 105 indicate the boundaries of overall temperature bands that increase progressively from bottom right to top left.

At the top right corner of the heat-exchanger, indicated by i80/e08, relatively hot internal air (i80) and relatively cool external air (e08) have just entered the heat-exchanger so that there is a relatively high temperature differential (i80–e08) between them, which indicates a relatively high rate of heat transfer—that is, most efficient cooling of the internal hot air. However, there is a relatively low temperature differential at the bottom left corner of the heat-exchanger, where relatively cool internal air crosses relative warm external air.

By way of a general, non-limiting example, for an ambient external air intake to the heat-exchanger of 20° C., the external air output of the heat-exchanger at the hottest point (e88) could be 30° C., where the temperature differential of 10° C. has been exchanged with internal air within the heat-exchanger. Conversely, for an internal air input to the heat-exchanger of 60° C., the internal air output at the coolest point could be 48° C. (i00), where the temperature differential of 12° C. has been exchanged with external air within the heat-exchanger. For thermodynamic reasons, the temperature differential above may be different for the different areas of the heat-exchanger e.g. top left and bottom right. Furthermore, the temperature of the internal air may not be uniform across all input channels of internal air to the heat-exchanger as a result of a) hot and cool spots of the heat-exchanger itself and b) solar loading differences on LCD displays at the front and back of the display. Ambient external air temperature is dependent on weather conditions and could for example drop to 0° C., whilst internal hottest temperatures remain high e.g. 60° C. due to solar loading heating the internal air. As shown in FIG. 3, the air temperatures as the air traverses across the heat-exchanger will vary relative to the associated input temperatures and the differential between internal and external air within the heat-exchanger.

Figure 4:
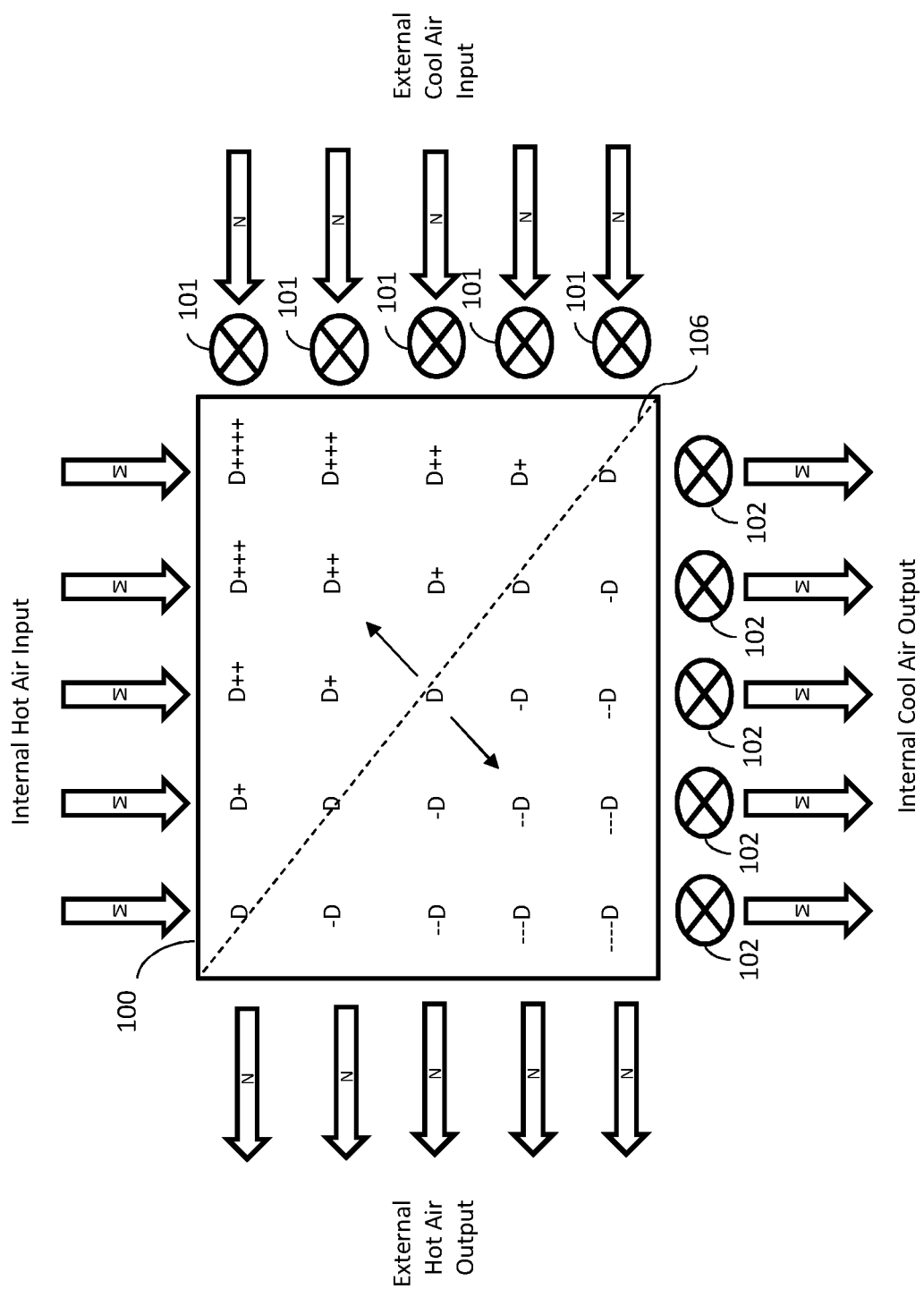
FIG. 4 is a view similar to FIGS. 1 and 3, illustrating temperature differentials at different points of the heat-exchanger.

FIG. 4 illustrates how temperature differential varies over the heat-exchanger 100. In this figure, D indicates a nominal temperature difference between internal and external air streams. This temperature difference D obtains at all points where, in FIG. 3, ix=ey—indicated by a diagonal broken line 106. To the left of the line 106, heat transfer efficiency decreases as the temperature differential decreases below the nominal differential D. To the right of the line 106, heat transfer efficiency increases as the temperature differential increases above the nominal differential D. The changes in temperature differential are indicated by one or more minus (−) prefix and one or more plus (+) suffix. The more minus signs, the less the temperature differential. The more plus signs, the greater the temperature differential. It may readily be seen that there is a considerable variation in temperature differentials, from the bottom left-hand corner to the top right.

Thus, the further both internal and external airstreams travel into the heat-exchanger, the less efficient the heat exchange becomes as the temperature difference between them reduces; where cool external air becomes hotter, and as hotter internal air becomes cooler. When used to cool the LCD panel in an outdoor advertising screen, this can create vast temperature differentials across the surface of the LCD panel—e.g. in the above example, hot spots at the top left and cold spots at the bottom right. As LCD panels are sensitive to temperature and may fail to operate in extremes of cold and heat, then such temperature spots are to be avoided. This is applicable to many other applications.

Figure 5:
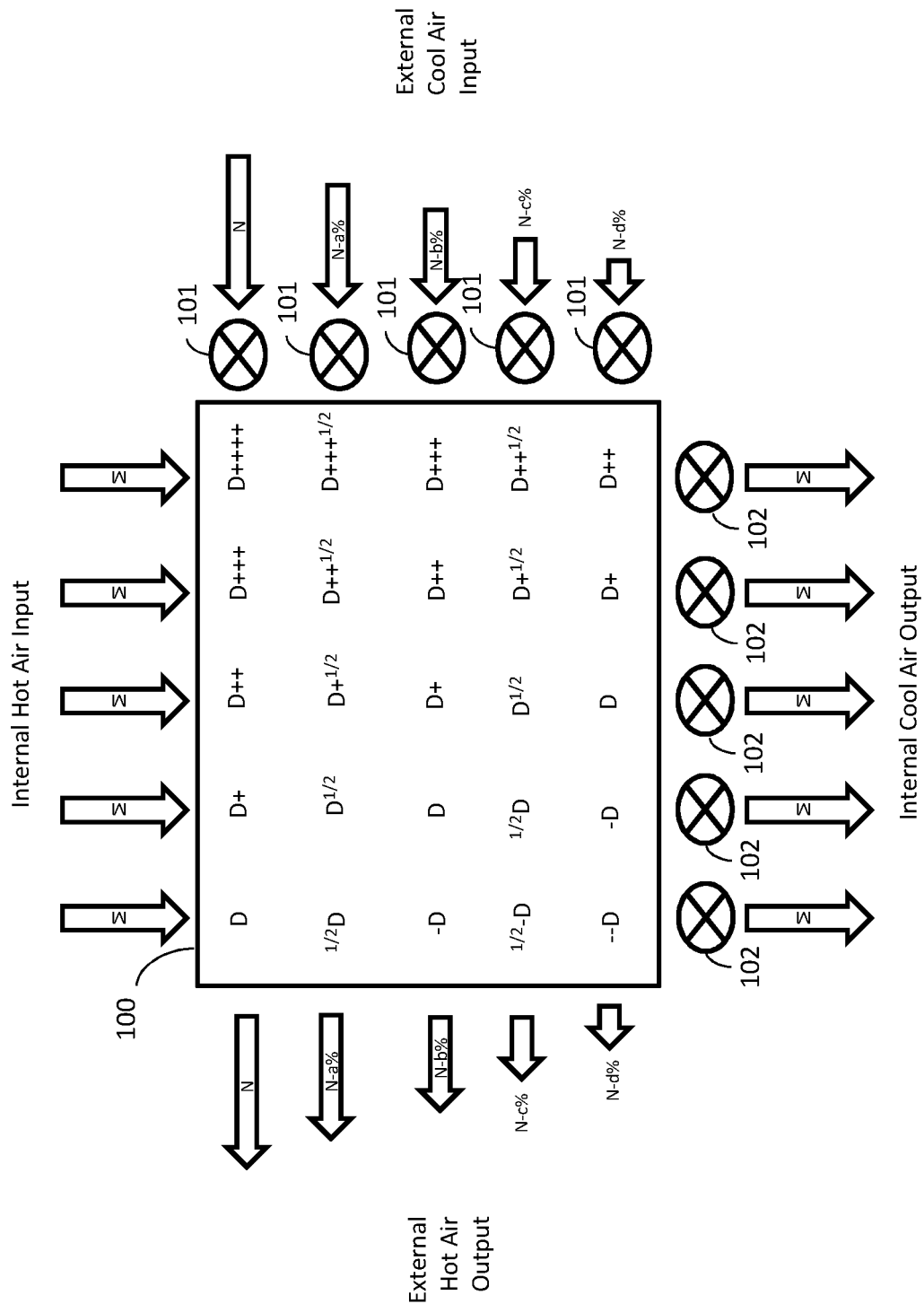
FIG. 5 is a view similar to FIG. 4, but with external cooling air passing through heat-exchanger channels at different flow rates.

FIG. 5 illustrates a first step in reducing the variations in temperature differential D over the surface of the heat-exchanger 100.

FIG. 5 is generally similar to FIG. 4, except that, in FIG. 5, the flow of external air through the rows 103 varies from row to row. This is achieved by varying the speeds of the fans 101.

In FIG. 5, the top fan 101 operates at normal speed to achieve a flow rate N. However, the next fan 101 below operates at a slower speed to achieve a flow rate N−a %. The next three fans 101 operate at progressively slower speeds to achieve progressively lower flow rates that are less than N by b %, c % and d %.

This means that, as the hot internal air travels further down the columns 104 and is progressively cooled, the cooling, external air travels at a progressively lower rate and therefore spends longer in the heat-exchanger. This increases the efficiency of the heat-exchange. The values of temperature differential D for the top row 103 of the heat-exchanger remain as in FIG. 4, since the flow rates of both internal and external air are unchanged. However, in all lower rows 103, the temperature differential D is improved from top to bottom. In FIG. 5, the qualifier ½ is introduced to indicate one-half of a full + or − measure, as the local value of D increases or decreases.

Figure 6:
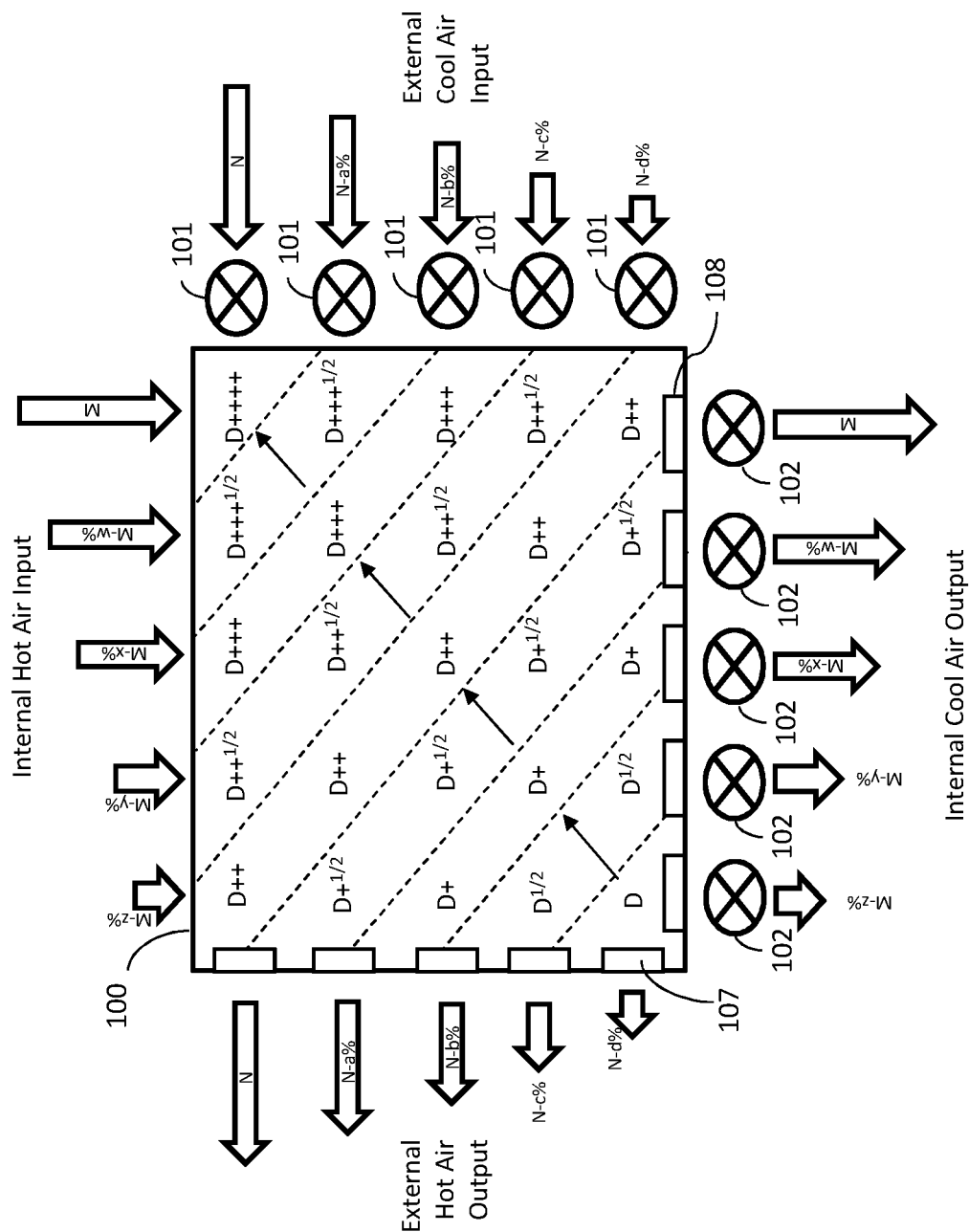
FIG. 6 is a view similar to FIG. 5, with both external cooling air and internal hot air passing through respective heat-exchanger channels at different flow rates.

The temperature differential values D are improved further in FIG. 6, where the speeds of the fans 102 for the columns 104 are progressively reduced from right to left. Thus, the rightmost fan 102 operates at normal speed to achieve a flow rate M. The speed of the fans 102 to the left are then progressively reduced to achieve flow rates that are less than M by w %, x %, y % and z %. The values of temperature differential D for the rightmost column 104 of the heat-exchanger remain as in FIG. 5, since the flow rates of both internal and external air are unchanged. However, in all columns 104 to the left, the temperature differential D is improved from right to left.

In fact, in FIG. 6, the lowest temperature differential D is now in the bottom left-hand corner and comparable to the normal value of D in FIGS. 4 and 5. All other values above and to the right are improved.

The above describes an ideal scenario. However, environmental conditions may create variations from the ideal position e.g. as a result of varying temperatures across the different internal air input channels 104 to the heat-exchanger and solar loading between front and rear displays 121.

By way of example, referring to the values shown in FIG. 6, external fan speeds may vary as follows a=20 (a 20% reduction of N), b=40, c=60, d=80; whereas internal fan speeds may be the same or different—for example w=18, x=38, y=59, z=79.

The fan speeds may remain static for a period of operation or adjusted in a dynamic way during normal operation e.g. to account for varying temperatures across the internal air input channels of the heat-exchanger as a result of varying solar loading, both throughout the day and between front and rear LCD displays, as well as shading from buildings, bus shelters, trees and other obstacles, particularly as the sun position moves throughout the day from dawn to dusk. Likewise, fan speeds may be adjusted in a dynamic way to account for varying external ambient temperatures throughout the day or night. It is worth noting that any changes to one or more internal fan speeds may or may not require changes to external fans speeds and vice-versa in order to deliver the require temperature differentials between associated internal and external air flow channels as a whole, across the heat-exchanger.

In FIG. 6, the speed of each fan 101, 102 may be controlled independently by controllers 124 and 125 within the housing 120, responding to temperatures and/or other parameters measured on or adjacent the heat-exchanger and/or at other locations within the display housing 120. The controllers 124, 125 control the airflow through the respective channels to tend to maximise temperature differentials between the internal air and the external air, at or around intersection points of the rows 103 and columns 104.

As an alternative or addition to varying fan speeds, fans may be operated at a fixed or predetermined speed and switched alternately on and off (e.g. by way of a variable duty cycle) to control the flow of coolant through the heat-exchanger.

By way of example, temperature sensors 107 are provided at or adjacent the exits of the rows 103 and temperature sensors 108 are provided at or adjacent the exits of the columns 104. Sensors may be provided at other locations on the heat-exchanger 100. A respective temperature sensor 107, 108 may not be provided for every row 103 or channel 104.

It will be appreciated from the foregoing that the illustrated examples may afford heat-exchangers that operate more efficiently and reduce the likelihood of excessively hot and cold spots. This in turn may afford more reliable operation of associated components, such as (for example)

the LCD panel 121, electronics modules 122, fans 101, 102 and power supply 123 as shown in FIGS. 2A to 2D. Improved reliability may be achieved directly by more uniform temperature distribution and by reducing the likelihood of condensation within the housing 120.

This may be particularly useful in the illustrated examples where, in practice, there may not be a great deal of space for a large heat-exchanger within the housing 120, the space of which may be dominated by one or more LCD panel 121. Thus, it is beneficial to have a smaller heat-exchanger of higher efficiency to fit the available space, as well as distributing temperature more evenly within the housing 120.

To summarise, greater heat-exchanger efficiency can be achieved by adjusting the air flow through each internal and external channel by adjusting the individual fan speeds. The internal and external air flow is reduced as the temperature differential between them lowers (i.e. as the efficiency lowers) such that the internal and external air spend longer in the heat-exchanger to aid heat exchange; This increases efficiency in the respective areas of the heat-exchanger.

By adjusting the air flow across all internal and external air flow channels (i.e. by adjusting individual fan speeds), then the efficiency of the heat-exchanger as a whole increases; allowing greater heat to be extracted from the internal air for a given size of heat-exchanger.

Although slowing down airflow may reduce overall throughput of the heat-exchanger, the overall effect is to take more heat out of the internal air, which heats up the external air for venting at the outputs of the external air channel side; the internal and external air volumes are in thermal contact through the heat-exchanger for longer, allowing more of the heat to transfer.

The differential fan speeds (and related volume air flow) are adjusted relative to each other to maximise the temperature differential within the heat-exchanger as a whole.

As an alternative to the illustrated examples described above, the fans 101, 102 may be controlled in groups. A fan 101, 102 may cause airflow through a plurality of channels of a respective set. Airflow through the channels may also or alternatively be controlled by respective restrictors 110 for the channels, adjusted to achieve a desired rate of flow. Such restrictors may be preset to desired values or adjusted in use by controllers. Such restrictors may restrict inlet and/or outlet apertures to airflow channels, and/or the cross-sectional areas of the airflow channels may be adjusted.

Although the above-described and illustrated examples of the invention have been described with reference to large-scale electronic displays, heat-exchangers embodying the invention may be deployed in wider applications such as heating, ventilation, air conditioning and cooling systems.

Figure 7:
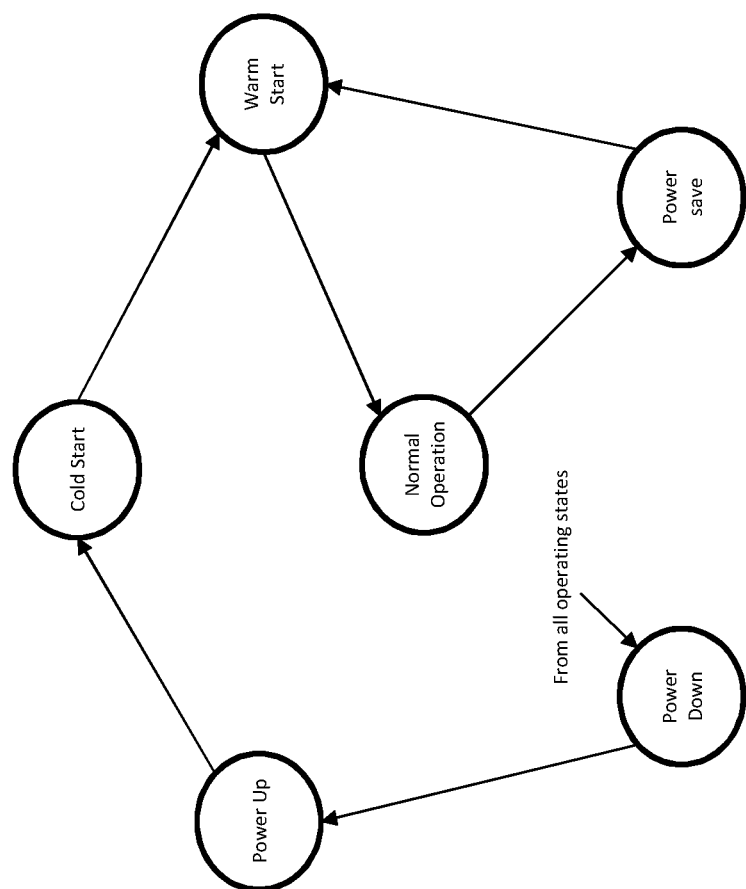
FIG. 7 illustrates sequences of operating states of a large-scale electronic display.

FIG. 7 illustrates sequences of operating states or processes of a large-scale electronic display, which may be constructed as indicated diagrammatically in FIGS. 2A to 2C. The following disclosure is of novel proposals for addressing condensation problems within such a large-scale electronic display.

As indicated in FIG. 7, the display is switched off completely by a Power Down process, which can be entered from any of the operating states. In order to switch on the display, it firstly enters a Power Up process and then proceeds via Cold Start and Warm Start processes to arrive at a Normal Operation state. From the Normal Operation state, it can enter a Powersave state, during which it is effectively on standby. From that state, it may re-enter the Warm Start process to return to the Normal Operation state.

The various states and processes are described below. Firstly, however, potential problems arising from potential condensation are reviewed.

Outdoor electronic displays (as with many outdoor products) are built from sensitive electronic components that may be subject to cold temperatures. Condensation can occur on surfaces (e.g. metalwork and sensitive electronics) whose temperatures reach the prevailing dew point; where water held in warmer air converts to water on cooler surfaces at and below the dew point. Any water forming on sensitive electronics, as a result of direct condensation or indirect condensation (by dripping from e.g. a cold metal surface), can cause short circuits, corrosion, and build-up of mould or residue on electrical contacts and wiring that damages and prevents normal operation of the electronics.

In the following description, the term 'metalwork' is used conveniently to refer to structural and other items within a display that have significant thermal mass, to the extent that they may have a surface temperature that lags behind any changes in in the temperature of surrounding air. In the context of large-scale electronic displays, a main chassis and any sub-chassis are typically of metal, so the generic term metalwork is both apt and convenient. However, it is to be understood that, in the context of this specification, such structural and other items may be of materials other than metal and term metalwork is to be construed accordingly.

For a given volume of air, raising its temperature reduces its relative humidity (RH). This is referred to as Isobaric heating when pressure remains constant. Condensation is caused by the RH reaching 100%, usually as a result of a reduction in air temperature; but can also be caused by a reduction in air pressure (Isothermic compression). The pressure will be assumed to be constant for the purposes of the following.

Dew point may be defined as the temperature to which air must be cooled to become saturated with water vapour. When further cooled, airborne water vapour will condense to form liquid dew. Or dew point may be defined as the temperature at which a given volume of air with specific moisture content will reach 100% RH and condensation will occur.

There is a known simple approximation that allows conversion between the dew point, air temperature, and relative humidity; which is accurate to within approximately ±1° C. (providing the relative humidity is above 50%). This is:

$$Tdp \approx T-((100-RH)/5)$$

$$RH \approx 100-5(T-Tdp)$$

Where RH=Relative Humidity (%); Tdp=Dew Point Temperature (° C.); T=Air temperature (° C.)

This shows that as the RH approaches 100%, then the dew point approaches the air temperature. It is desirable to both raise Air Temperature and lower Relative Humidity (RH) for a given volume of air. More complex and accurate calculations exists such as the Magnus formula and Arden Buck equation.

When outdoor electronic displays are first installed or are serviced, there is often a delay between the physical installation or servicing and the application of power to energise the display. Where a display unit is cold and relative humidity is high, it is susceptible to internal condensation on sensitive electronics that both control and include the backlight of an LCD panel or the like. An LCD backlight typically provides a significant source of heat generation within a display; increasing its brightness typically increases the heat of the surrounding (internal) air and increases surface temperatures within the display. This in turn raises the dew point such that condensation evaporates; which is then held within the air within the display. The warmer the temperature, the lower the relative humidity.

Applying power to sensitive electronics when the display unit is cold and relative humidity is high is at risk of causing problems due to condensation—but without powering on the electronics, then the backlight cannot be turned on to generate the necessary heat to reduce RH and condensation. Thus, we have appreciated a need to heat the display unit quickly to reduce relative humidity and raise the dew point such that air circulating within the unit has lower relative humidity and is thus less likely to condense onto cold surfaces—which are typically metal within a large-scale display but could be of other materials.

Cold air brought into the external air side of a heat-exchanger within a display unit is progressively heated as its traverses across the heat-exchanger to the outlet, as internal heat is exchanged to cool the internal temperature within the unit. Any cold morning air brought into the unit, via heat-exchanger air intake fans, cools internal surfaces to form cold spots and creates the possibility of internal condensation on surfaces that come into contact with warm humid internal air. This causes the temperature of the local air around the cold spot to be lowered, raising RH that then causes condensation on the cool surface as the dew point is reached.

If internal circulating air is cool (e.g. after a cold start), then there is very little temperature differential between the internal circulating air and the localised external air around the cold spot (which can thermally conduct to the internal area), so that RH may more quickly reach 100% and cause high levels of condensation. We have determined that, by pre-heating the internal air as quickly as possible and as hot as possible (within operating limits of the internal components) this creates a larger temperature differential between the dew point of the localised cold spot (as a result of thermal conduction from the external cold air) and the internal circulating air, resulting in lower RH and lower risk of condensation. The hotter the internal circulating air gets around the cold spot, then the more the condensation evaporates. Conversely, the greater the volume of cold air that persists in the external air flow, which thermally conducts to an internal surface, then the greater the cooling effect on the local air around the cold spot and the greater the condensation.

If internal surfaces of the display unit are already hot (warmed up) then there is a greater temperature differential with the external cold air and the area of the "localised cold spot" will be reduced. However if the internal surface is cold, then the external cold air will further cool the internal surface and increase the area that will generate condensation (due to the lower temperature differential) and create a much wider area for the internal "cold spot", which will have a much greater cooling effect leading to much greater RH and associated condensation. With cold metalwork or other surfaces, and incoming cold air from the heat-exchanger, then the internal temperature as a whole is susceptible to lowering quickly and raising RH to cause condensation.

Cold air input from the heat-exchanger therefore needs to be controlled to avoid "over cooling" of the internal air steam as the metalwork gets up to full heat. The internal metalwork or other surfaces need to be heated sufficiently to prevent thermal conduction from outside causing condensation, before bringing cold external air into the heat-exchanger.

Complex temperature control and management is therefore required to heat up the display unit as quickly as possible but minimise the risk of condensation by bringing in cold air into the unit that conducts to create cold spots at or below the dew point on internal metal or other surfaces; combined with bringing in sufficient cooling to manage high temperatures to prevent the unit from overheating as a result of backlight brightness levels and solar loading.

Although measures can be taken to reduce moisture content within internal air e.g. using silica gel, external moisture can re-enter the display unit when the door is opened (e.g. for servicing), which leads to the need to manage relative humidity, temperature and associated condensation on an ongoing basis.

A heat-exchanger typically uses numerous input fans that are enabled together to draw external air through the heat-exchanger. Since fans have a minimum speed to operate, when enabled together this may pull too much air through the heat-exchanger that "over-cools" the internal air flow as the unit comes up to full heat (i.e. metalwork heats up to prevent the cool air causing condensation).

Sensitive electronics such as PCs, power supplies, video electronics can be "hardened" to be less/non-sensitive to moisture, using known techniques such as conformally coating the surface of the electronics with a moisture repellent material or "potting" the electronics within a waterproof resin. This is the meaning of the term "hardened" in this specification. However these methods are expensive and hinder manufacture and repair of electronic assemblies once applied, often rendering the assembly unrepairable, requiring full replacement if problems arise, thereby incurring additional costs.

Thus, we have appreciated a need for an apparatus and a method that allows a large-scale electronic advertising display to be started under cold conditions where temperature and humidity can be managed effectively, without causing humidity/condensation issues whilst the unit gets up to full operational conditions. Preferably, once an electronic display has been brought up to full operational conditions, its temperature and humidity can be controlled at an optimum level.

Likewise, if an operational electronic display unit is powered down or placed into reduced e.g. "standby" operating modes (e.g. overnight), then there is a need to manage the temperature, humidity and condensation to bring the unit back up to full operation e.g. in the morning.

Humidity/moisture issues are compounded for field serviceable equipment, as moisture can re-enter the unit when the door is opened. By managing humidity centred on dew points, this may obviate the need to seal and service units in environmentally controlled environments for ease of repair in the field.

The coolest part of a heat-exchanger in an electronic display unit is typically at the external air intake side (i.e. bringing in ambient cold air) where it meets with already cooled internal air at/towards the internal air output—that is, where the temperature differential between internal and external air is least at the cold external air input. Thus, this location is most at risk from developing condensation internally when first bringing cold air into the unit, when powering up in cold environments. Any condensation developing on internal metalwork of the heat-exchanger in this area is at risk of dripping onto sensitive electronics below.

Understanding the dew point in this area is important, to ensure that no condensation is formed as a result of turning on the heat-exchanger fans to bring in cold air, for example by:

direct measurement of dew point from temperature/humidity sensors mounted on metalwork (or other surface) of the heat-exchanger; and/or calculation/prediction/inference by measurement of temperature/humidity in air flow within the external air path at both input (i.e. ambient external air) and output (exhaust) of the heat-exchanger; and within the internal air path at both input and output of the heat-exchanger.

It is useful to determine ambient (external) temperature in order to best control how much cold air external fans bring into the heat-exchanger. However, it is difficult to detect this when a temperature sensor is placed within a display, as ambient temperature can only really be measured when the external airflow fans are running in order to draw ambient air across the sensor. Without turning on external fans, the sensor may measure heat radiated from the heat-exchanger i.e. an internal temperature.

Management and understanding of dew point is therefore important when cold starting a display unit in a cold environment to ensure condensation is not generated by the heat-exchanger as a result of running the external fans for too long.

It is worth noting that condensation is "distilled water", i.e. it has been distilled to water from the air. Distilled water (in liquid form or when frozen) is a very poor conductor. If condensation forms (or drips) onto high-voltage circuits such as AC mains power supplies, then it may cause protection circuits to trip e.g. where there is an earth leakage. If the environment is such that there is risk of condensation, then it is preferred to protect high voltage/mains circuits from condensation e.g. by choosing IP67 or IP68 rated components, sealing, conformally coating, potting, partially potting, covering or restricting air (that carries moisture) around the sensitive AC components.

If condensation forms on low-voltage electronic circuits e.g. 12 Volt DC or 5 Volt DC, then there is a very low risk of the condensation causing short circuits on first (or low) exposure. However condensation causes metal surfaces (e.g. semiconductor, connector pins etc) to rust and prematurely age over time, particularly where there is continued/regular exposure. As condensation then forms on aged/rusted low voltage electronic circuits, the condensation picks up impurities from rusted/aged metal as well as atmospheric contamination, dust etc which increases the conductivity of the condensation. Low-voltage circuits are therefore more prone to short circuit issues (and open circuit issues as metal paths deteriorate) related to condensation over a longer period of time (compared to high voltage circuits where currents are much higher), as the impurities build up over time.

During initial power up conditions (where a unit has been powered off and exposed to a cold ambient environment for a period of time), we have thus appreciated that desirable requirements are to: protect ("harden") high voltage electronics to prevent shorts and earth leakage; and minimise the frequency that cold start conditions arise (where there is increased risk of condensation) to prevent build-up of impurities on low voltage circuits to prevent open and short circuits.

We have appreciated that there are four distinct operational states where humidity and related condensation need to be managed (based on dew point) within outdoor, large-scale electronic advertising display units—and other equipment with a heat source. These are illustrated in FIG. 7.

Cold start—where the unit has been off for a period of time and it has not been able to maintain a desired internal operating temperature—low temperatures yield high RH. Care needs to be taken before applying power to moisture sensitive components (such as a controlling PC within the unit), which are required to manage the system as a whole. Pre-heating and dehumidification can ensure that environmental conditions are acceptable before starting and passing control to the PC.

Warm start. In an electronic display unit, an LCD panel (or the like) tends to be the most environmentally sensitive of the electronics. Thus, care needs to be taken to ensure that there are no cold spots at or near the LCD panel before turning it on. Warm Start is the process of turning on the LCD panel after the correct environmental conditions have been achieved and setting the initial operating temperature high to aid quick warming up of the metalwork (or the like), in order to minimise condensation as external heat-exchanger fans are first turned on. It occurs following either of two related processes, namely:—

After Cold Start. In this case, Warm Start can be considered as an extension to Cold Start, where the PC (having been sequenced ON when environmental conditions permit) manages the turning on of the LCD Panel before entering Normal Operation, centred around an initial high start-up temperature; and After exiting "Powersave" (where the backlight is powered off during non-advertising hours) to enter into normal operational mode, by powering up the LCD panel—typically when appropriate environmental conditions exist at dawn (or retail store opening time), before entering Normal Operation, centred around an initial high start-up temperature Normal operation, which aims to maintain a constant internal temperature at desired levels by adjusting cooling air flow in response to heat generated by both the LCD backlight and solar load. Under normal operating conditions, the internal temperature level will be "NORMAL" e.g. 20 degrees C. However it may be raised to a HIGH level e.g. 40 degrees C. after (1) WARM START (to warm up the metalwork, as described) AND (2) As a pre-emptive measure to retain heat (by taking in less cooling air) when cooling down (e.g. at night) to delay the possibility of turning on a heater during Powersave. Temperature management will be particularly sensitive to bringing in external cold air through the heat-exchanger to avoid condensation forming; and ensuring that temperature and RH are managed at acceptable levels.

Powersave, where the LCD panel and backlight are turned off outside advertising hours (typically overnight). When the backlight is turned off, the temperature drops and RH rises (even with external heat-exchanger fans off); and metalwork starts to get cooler. It is desirable to monitor temperature/humidity and prevent the humidity from rising to unacceptable levels that risk dew point (e.g. 50% RH) on the cold metal. The display may comprise a primary heats source and the backlight can be used as a secondary heat source—e.g. turned on with the scaler off, so no content is displayed—to help maintain an acceptable temperature and RH level. Upon exiting the Powersave process, it is important to re-enter the Warm Start process to manage cold air intake.

Elements for use in examples of apparatus and methods in accordance with the invention, as part of a process (in part or whole) to bring an outdoor, large-scale electronic advertising display unit into normal operation, include the following:—

1. Sensors

When the unit is off for a period of time, the temperature of the unit (and mass of metalwork) will track ambient temperature. Temperature and humidity sensors are placed around the inside of the unit to help determine dew point within the unit that may cause condensation. In particular, a temperature/humidity sensor is positioned directly on the metalwork of the heat-exchanger at the coldest location (see earlier description) susceptible to condensation. This is the location at most risk for generating condensation as a result of thermal conduction from the external cold air to the internal metal surfaces and surrounding localised air, which may then cause additional cooling (beyond the heat-exchanger's normal function) that raises the internal RH. Condensation occurs as the RH reaches 100% when the internal air comes into contact with the cold surface of the heat-exchanger at or below the dew point temperature.

Optionally, as the heat-exchanger starts to warm up, an external fan may need to run briefly to draw ambient air in and across a temperature/humidity sensor within the external airflow at the entrance to the heat-exchanger.

Temperature and humidity sensors are initially monitored and managed by a power management board (PMB) to aid the Cold Start process; and subsequent monitored and managed by the sensitive electronics (e.g. PC) on completion of the Cold Start process.

2. Non-Sensitive Control Electronics (Power Management and Associated Power Supply)

Dedicated embedded electronics are hardened to work under cold environmental conditions and can be first powered to control initial start-up, including 1) power management control board (optional) and 2) 12 v power supply. These items may comprise analogue or digital electronics.

The electronics may be hardened through choice of electronic components designed to operate in cold/moisture environments; and or conformal coating; and/or potting within resin; and/or selection of IP67/68 rated components or assemblies; and/or other known hardening methods that allow a power management board PMB and associated power supply unit PSU to operate.

The power management board PMB may be capable of reading sensors, carrying out decision making and controlling power to other devices e.g. heater, dehumidifier and sensitive control electronics e.g. PC, video, LCD driver electronics. Environmental control is passed to the sensitive PC when finally powered, which can then continue sequencing on further sensitive electronics such as the LCD panel, through the Warm Start process 3. Heater Initial use of one or more heater under cold conditions may be controlled from a power management board, such that the heater is turned on when the environment (temperature, humidity, dew points) are not suitable for starting sensitive electronics.

The heater will raise the internal temperature and lower the RH to help prevent condensation on cold surfaces at the dew point.

The heater can be turned off once sensitive electronics have been powered (enabled by the power management board), whereupon full environmental temperature control is then passed to the sensitive electronics—e.g. a PC.

4. Dehumidifier

Use of a dehumidifier under cold conditions may be controlled initially the power management board. The dehumidifier is turned on when the environment (temperature, humidity, dew points) are not suitable for starting sensitive electronics. The dehumidifier removes water content from the internal air and transfer it to outside of the enclosure of the display unit, to further reduce RH.

Control of the dehumidifier is passed to the sensitive electronics once it has been powered on; if required, the dehumidifier may be left on whilst the full Cold Start process completes. It may also be turned on until all water content has been removed or falls below an acceptable level, to aid the lifetime operation of the dehumidifier and/or display. The dehumidifier may be re-enabled if RH increases above an acceptable level—e.g. as a result of exposing the internal sensitive electronics to ambient air as a result of opening a door of the display unit or due to a breach of door seals.

The dehumidifier may run continuously until RH is below a pre-set acceptable threshold; especially as the use of an hydrophobic filter (e.g. a Gore vent) that equalises internal and external air pressure may introduce additional humidity from external ambient air on an ongoing basis—i.e. the unit is not fully hermetically sealed from external ambient air 5. Sensitive Electronics Control of Backlight for Heat Generation As a backlight for an LCD panel (or the like) typically generates heat, it can serve as a controlled heat source for the display unit, the control being provided by sensitive electronics of the unit, once the electronics has been enabled. Such electronics may typically comprise a PC, LCD display, video circuits, power supplies, high voltage drivers and so on—any other restricted temperature/humidity range products that are not treated for use in cold environmental conditions, and which are enabled once satisfactory environmental conditions have been established.

Once enabled, the sensitive electronics may also control operation of any other heat source within the unit.

6. Managed Heat-Exchanger Start Up (Individual Fan Control/Burst Operation)

Individually controlled internal and external fans (e.g. 1-5 in number) control how cold air is introduced into the system. The fans are selectively turned on as the display unit heats up in a way that minimises risk of condensation. They are managed in a relative ratio that permits efficient heat-exchanger use to deliver a substantially constant internal operating temperature.

They are selectively turned off as the display unit cools down in a way that minimises risk of condensation.

Figure 8A:
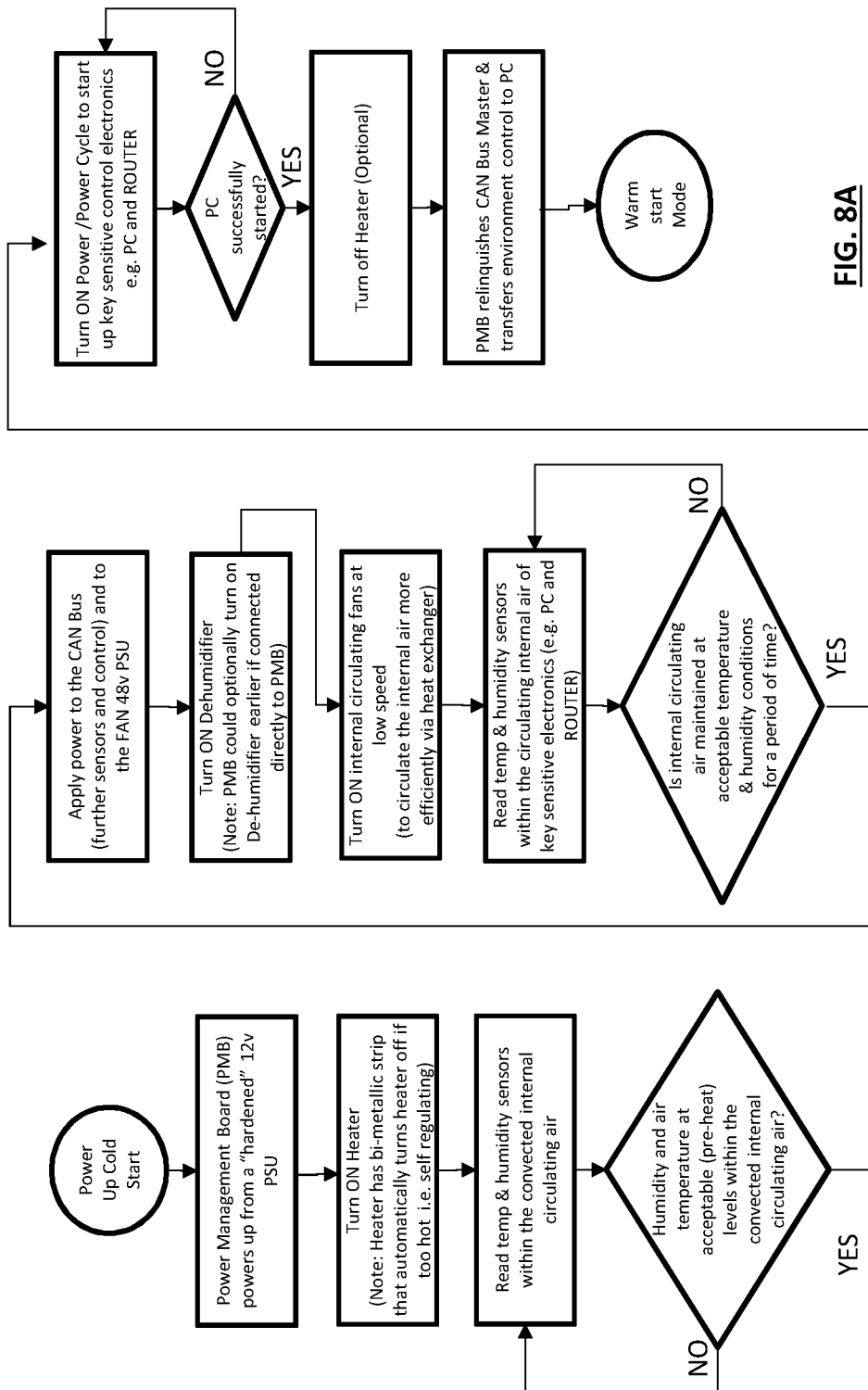
FIG. 8A is a flow chart illustrating a Cold Start process of the large-scale electronic display.

Building on the preceding description, FIG. 8A illustrates a Cold Start operation of a large-scale electronic display unit. The process may be understood by following the flowchart of FIG. 8A.

Cold Start occurs every time the unit is powered up and ensures that sufficient temperatures and dew points are achieved to successively enable environmentally sensitive electronics (within their associated environmental specification).

A Power Management Board PMB that is itself optionally hardened is powered up from a hardened 12 V PSU. The PMB turns on an internal heat source to generate heat before any other electronics are enabled, in order to pre-heat the internal air; which will reduce RH within the internal air.

The heated internal air will circulate naturally through convection, by firstly rising as it becomes hot, cooling against glass at the front of the display and then falling to the bottom of the unit to initiate a convected circulating air flow. One or more small 12 v fan may be used to help guide circulating air across sensors etc.

The convected circulating air temperature and humidity is sampled; and when reaching acceptable levels then the PMB turns ON a CAN bus (as one example of an industrial Multidrop or Fieldbus network for data communication), which then allows the PMB to communicate with further control and measurement electronics within the unit. Temperature and humidity levels may be measured directly in real time, or a pre-heat "time period" may be predetermined through a previous characterisation of the unit or PC based thermal modelling.

The PMB may then turn on a dehumidifier, if provided. The dehumidifier could optionally be turned on earlier if connected directly to the PMB.

The PMB will turn on internal circulating fans to more efficiently circulate internal air through a heat-exchanger of the unit although, at this time, external heat-exchanger fans will remain off.

Where appropriate, further temperature and humidity sensors readings can be taken to ensure that the pre-heat internal temperature is stable, to minimise RH. When temperature and humidity reach acceptable levels, the PMB turns on a PC and Router of the unit (which are more sensitive than CAN bus electronics), enabling the PC to take further control of managing the environmental conditions.

The PMB will then relinquish being master of the CAN bus, so that the PC can then control and monitor all electronics connected to the PC CAN bus e.g. sensors, fan control. In particular, the PC can then manage (as part of the subsequent Warm Start process) the turning on of the LCD panel which is typically the most sensitive part of the display unit. The PC will also control the initial heat source, if needed further.

It may be noted that internal circulating fans and associated CAN bus electronics can be turned on sooner or immediately if they are "hardened" to withstand the environmental conditions (e.g. conformally coated to prevent condensation issues). However, this approach will tend to provide lower cost benefits.

Figure 8B:
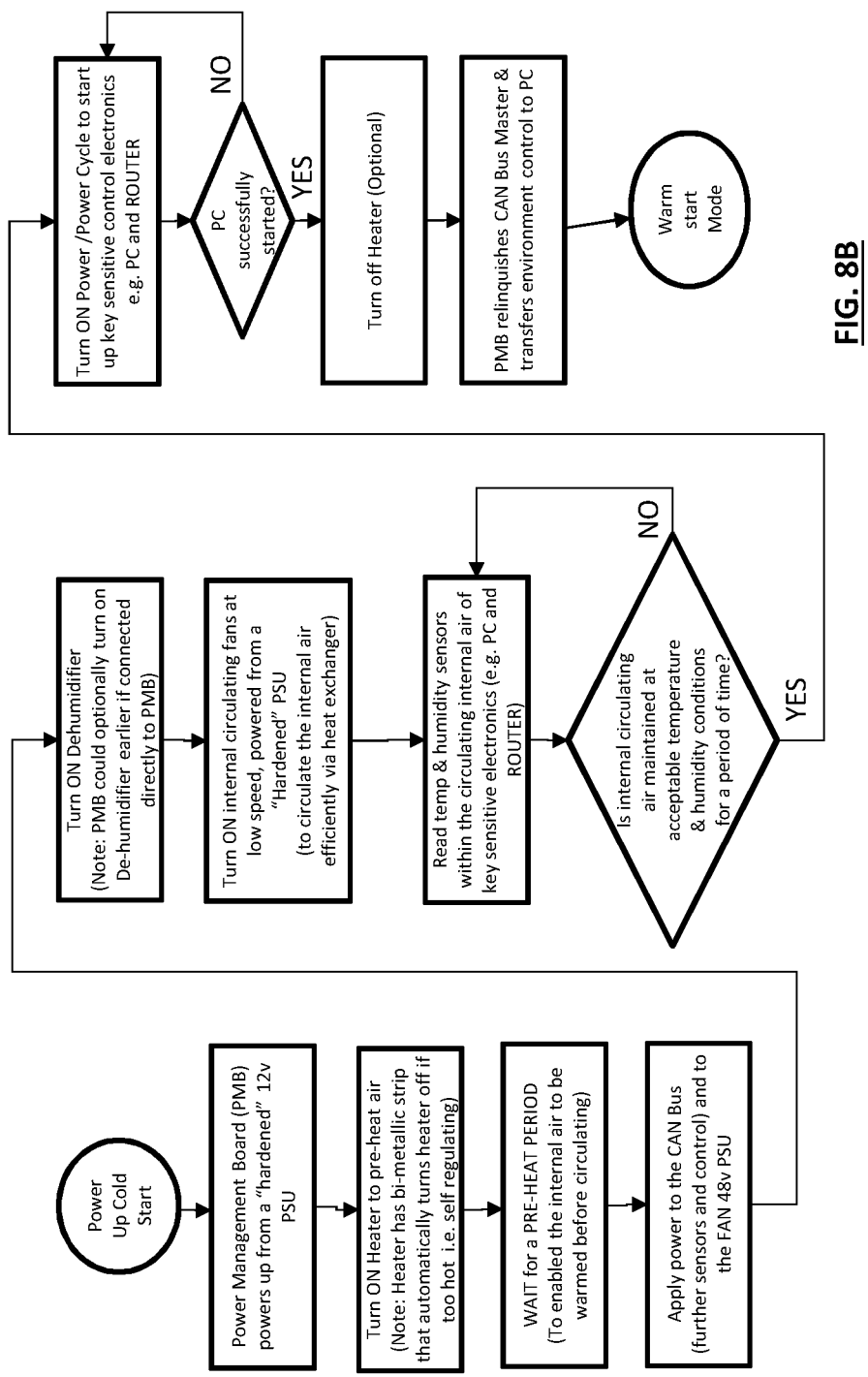
FIG. 8B is a flowchart similar to FIG. 8A, but employing a predetermined pre-heat period.

The process of FIG. 8B is similar to that of FIG. 8A, except that, instead of initially measuring temperature and humidity levels directly in real time, a pre-heat time period is predetermined through a previous characterisation of the unit or PC based thermal modelling.

With reference to FIG. 8B, when the heat source is initially turned on, convected air circulation is slow, without fan assistance. Under the following preferred conditions, the start-up time for completing the Cold Start process can be shortened by providing the conditions to turn on the internal circulating fans sooner rather than later, to more effectively distribute internal heat within the air. The preferred conditions are:

Fan power supplies are hardened (IP67/68 rated, covered, semi-potted, etc to protect from condensation), as well as the 12 v PSU;

There is a temperature controlled environment when fully operational, such that low voltage circuits have minimal exposure to condensation over time;

Infrequent power cycling during operation such that the cold start process is entered only for installation or maintenance purposes; and Low voltage circuits (e.g. PMB, CAN bus components) utilising electronic components specified for the environmental temperature range, noting that these do not necessarily need to be hardened (through conformal coating, potting, sealing etc) due to the purity of condensation (distilled water) and minimal exposure to condensation (i.e. impurities) given the preceding conditions.

The PMB turns the heater on, but waits for a period of time to pre-heat the internal air before then turning on the internal fans (via the CAN bus) to circulate the warmed air. The CAN bus electronics are low voltage, enabling monitoring of all sensors and control of all fans etc. The warm air will be circulated until the temperature and humidity conditions are acceptable for the PC and ROUTER to operate.

Once the PMB has successfully started the PC it will relinquish the CAN bus master, allowing the PC to take control of the environmental management; and to then get the display unit into Normal Operation via the warm start process, which ensures the environmental conditions for turning on the LCD panel are achieved before turning on the LCD panel.

The PMB could optionally manage the environmental conditions to control the LCD panel into Normal Operation). However, it is preferred to get the PC operational as soon as possible, as it typically has far greater processing power and has prime responsibility for operational environmental management. Also, the PC needs to manage the LCD panel through Warm Start after completing a Powersave process where the LCD is turned off. Warm Start can be considered as part of Cold Start when processed for the first time.

Figure 8C:
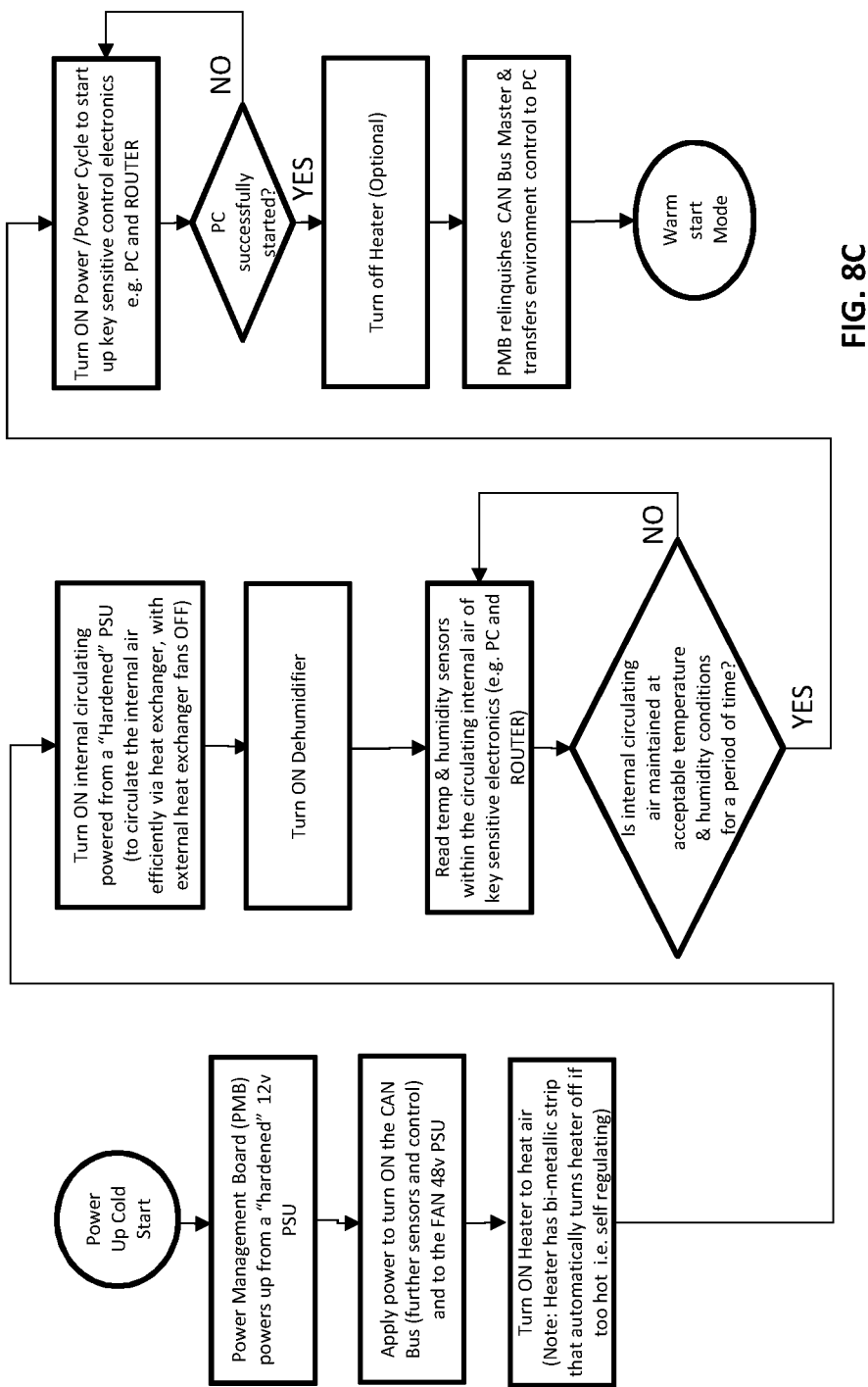
FIG. 8C is a flowchart similar to FIG. 8B, but in which a heater is controlled as a device on a CAN bus.

In the optional variant of FIG. 8C, the heater is controlled as a device on the CAN bus, rather than being connected directly to the PMB. Thus, the PMB turns on the CAN bus upon power-up and immediately turns on both the heater and the internal circulating fans without pre-heating the internal air.

This may be required in some heater physical positions (e.g. towards the top of the unit) where pre-heating air only heats the top of the unit, and where circulating convected air cools down too much against cold glass to leave the bottom of the unit remaining cold.

Heated air at the top of the unit will absorb moisture into the air. If the heated air is then circulated to a cold area at the bottom of the unit it may condense on surfaces in this area that are at or below the dew point. In this case, it is therefore advantageous to turn on the circulating fans at the same time as the heater in order to absorb and manage condensation throughout the unit as a whole by distributing heat.

By placing the heater on the CAN bus, it allows the PC to control the heater directly, rather than via the PMB, for subsequent management of humidity and temperature, once the PMB has relinquished control of the CAN bus when the PC has been started.

Features and advantages of using a CAN bus are now discussed. CAN (Controller Area Network) bus is a multi-drop bus network protocol that is used widely in the automotive industry.

Digital displays used for advertising purposes have traditionally been developed from PC based technologies. Consumer grade LCD displays were often used that were limited in size as a result of availability for domestic consumer applications e.g. 24", 32", 40" (61, 81, 102 cm). As a result, display technology has evolved around a central processing core e.g. PC with point to point connections to display, fans and sensors; and/or short multiplexed serial connections to local sensors e.g. using PC, a multidrop bus designed for chip-level working, rather than connections between separate assemblies.

As larger display technology has become increasing commercially viable, connections between the central processor e.g. PC and sensors and other input/output devices have remained point to point; such the central PC core is in control of reading the input devices, processing and managing output devices directly. Longer wiring lengths are less immune to electrical noise e.g. from larger fans that are needed to cool larger displays; as well as being a source of noise for other devices. As cooling and thermal management becomes an increasing issue for larger displays (and associated backlights), then the more challenging the air flow management also becomes as space gets restricted, particularly as media clients desire cosmetically slimmer screens. Routing multiple point-to-point cabling between central processing units and sensors distributed within a display provides barriers to air flow.

The use of a multidrop bus, such as a CAN bus, mitigates these issues by decentralising immediate processing of "dumb" input devices (e.g. sensors) and output devices (e.g. fans) from the central processing unit; by distributing the intelligence locally to the desired vicinity of the device by making the input/output device intelligent e.g. using a local microcontroller, such that it does not need to be immediately processed by a central processing unit in real-time.

Whilst internal networks such as Ethernet have been used to network PC and router elements, this networking technology is not cost effective or multi-drop for networking the input/output devices to a PC for higher level management.

There are benefits to integrating multiple input sensors and/or control output devices with a common microcontroller to provide multifunction intelligent input/output modules that can be distributed at locations around a large digital advertising display to perform both specific and varied functions; dependent upon the monitoring and control requirements at specific locations within and/or attached to the electronic display. Example intelligent I/O modules include:—
- Environment Module—integrating temperature, humidity and light sensors with a common microcontroller that provides CAN bus connectivity to other intelligent I/O modules and a central electronic processor e.g. PC
- Fan Control Module—integrating PWM fan speed control outputs, dehumidifier control outputs as well as fan speed, temperature and humidity sensors with a common microcontroller that provides CAN bus connectivity to other intelligent I/O modules and a central electronic processor e.g. PC
- Display Module—integrating video and backlight output controls as well as video loss/presence detection, temperature and humidity sensors with a common microcontroller that provides CAN bus connectivity to other intelligent I/O modules and a central electronic processor e.g. PC
- Power Switching Module—providing power switching to various elements e.g. backlight, heater as well as other monitoring functions such a door open/closed contacts
- Power Management Board (PMB)—providing an interface to a central electronic processor e.g. PC, enabling the PC to interface with the CAN bus network to provide central processing control of all distributed intelligent I/O modules via the CAN bus network.

Typically:
The PC interfaces to the PMB via a USB port
Any high level Master/Slave/Notification protocol used to transfer data between the electronic processor and distributed I/O modules is encapsulated within its own data link transfer protocol to provide a resilient way of communicating between the PC and the PMB
The microcontroller on the PMB bridges the high level Master/Slave/Notification protocol between the USB connection (to/from PC) and the CAN Bus (to/from distributed I/O modules)
Thus allowing the electronic processor (master) to poll a specific I/O module (slave) using a destination address that matches the I/O module's allocated Identifier address; set as part of a self-configuration address process detailed herein.

Examples of multiple functionality (dependant on location) include:—
A common Environment Module that can
- attach to and/or process inputs from different sensors e.g. an ambient light sensor or an RGB light sensor that senses light output from the front face of an LCD display
- be positioned at/near the top of the LCD display to measure RGB light from the front face of the display, as well as specific temperature and humidity environmental conditions in this hotter area of the display
- be positioned at/near the bottom of the LCD display to measure ambient light, as well as specific temperature and humidity environmental conditions in this cooler area of the display
- Be positioned at the top and bottom of multiple displays e.g. back-to-back displays
- Be positioned in other areas e.g. hot spots, cold spots etc, where environmental conditions need to be managed as part of a thermal management control system.

A common Fan Controller Module that can
- Be positioned near and control heat exchanger internal airflow fans
- Be positioned near and control heat exchanger external airflow fans
- Monitor associated fan speeds on internal or external fans
- Measure associated temperature and humidity within associated internal or external air flows
- Control other devices e.g. dehumidifier if available at the specific location.

Other repurposed intelligent I/O modules may optionally include and allow other varied sensors to be attached dependant on their location e.g. shock sensors, tilt sensors, door sensors, energy sensors via common means e.g. contact closures, pulse counting etc; where the input signal is conditioned/processed in a suitable manner e.g. de-bounce signals, pulse counting and where necessary carry out alarm processing for notification to the central electronic processor e.g. PC.

Multifunction capability is enabled by allowing different operating software/firmware to run on the microcontroller that is specific to the function required for the desired location. This can be facilitated through a self-configuration addressing process as follows:—
Providing an input configuration to the intelligent I/O module that can be read by the microcontroller, e.g.
Selectable switches e.g. DIP switches
Jumper settings
Configured on the cabling/wiring to the intelligent module at the specific location
Hardcoded within the microcontrollers software/firmware
Other means e.g. dynamically assigned by central electronic processor or configuration tool etc.
The microcontroller selects and runs built-in desired operating software or operating mode dependant on the configuration selected
The microcontroller maps the input configuration into a CAN bus unique identifier (in whole, part or through cross-referenced look-up translation) that allows the intelligent I/O module to
Be uniquely identified on the CAN bus by all other intelligent I/O modules and the central electronic processor e.g. PC Provide a higher level addressing means (above the standard CAN Bus ISO model (layer 2) datalink layer) so that the specific intelligent I/O module to be uniquely addressed as a "destination" "slave" by a "master" device e.g. central electronic processor e.g. PC for higher level data communication purposes over the CAN bus Noting that the input configuration for both multifunction operating mode selection and CAN bus identifier selection can be a common or separate configuration means.

Figure 11:
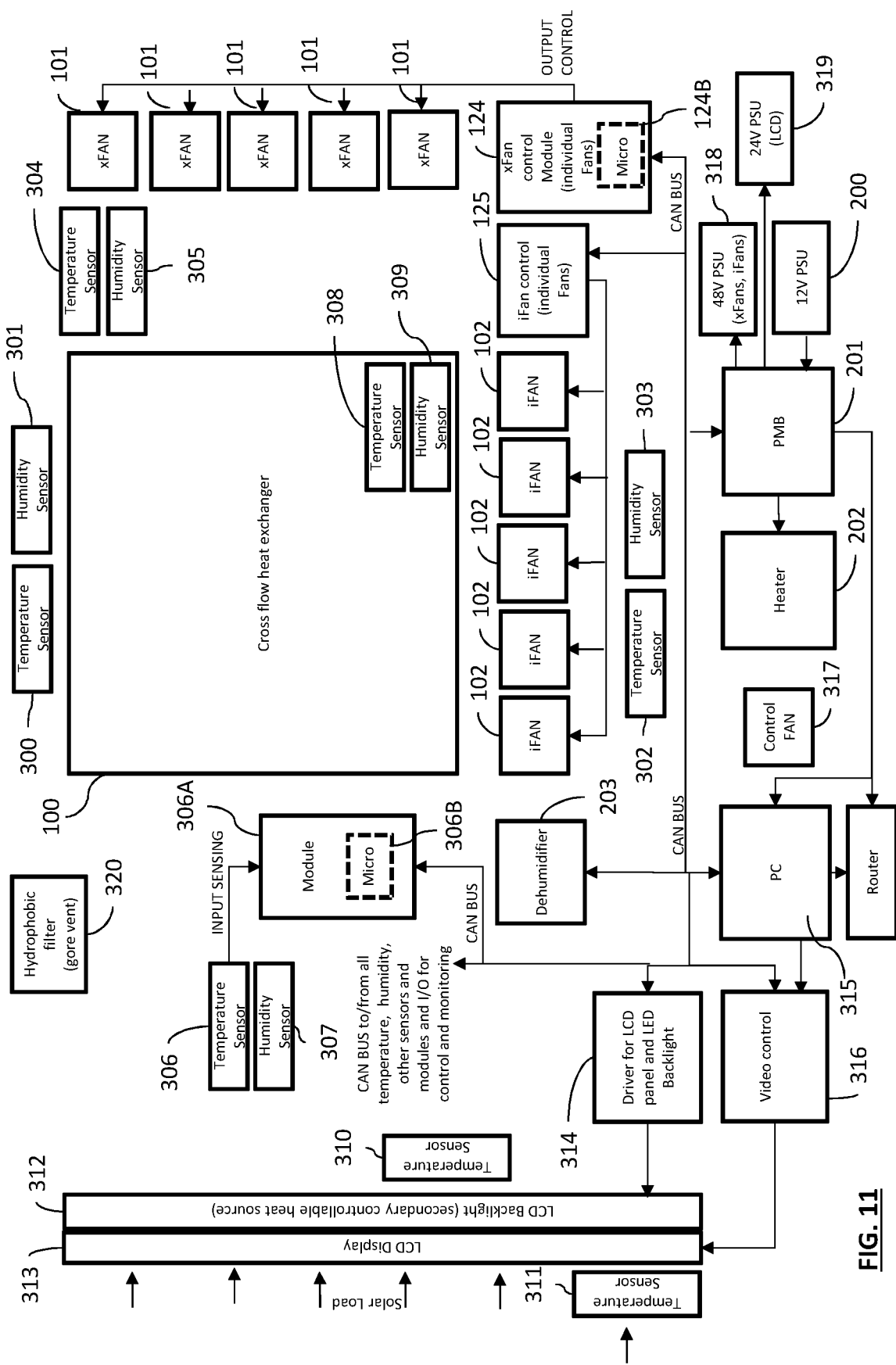
FIG. 11 is a schematic diagram of elements and components for use in controlling dew point with a crossflow heat-exchanger of the large-scale electronic display.

A modular/distributed approach provided by a multidrop bus combined with multifunction/self-configuration addressing functionality is advantageous on many levels e.g.

a) Allowing a common "Input/Output Device" to be used in multiple locations e.g. an intelligent temperature/humidity sensor that can be positioned in various distributed locations e.g. heat-exchanger metalwork, at internal air inlets and outlets of heat exchanger and, for example, all other locations identified in FIG. 11.

b) Provision can be made to extend the CAN bus for use with other add-on assemblies and input/output accessories, that when integrated with, for example, an Outdoor single Advertising Display Assembly create new and extended products where input and output devices are distributed across various combinations of assemblies. The multidrop bus may be used as an expansion means but where external modules can operate either autonomously (where intelligence is distributed) or under direct control of a main processing unit within the outdoor display.

Examples include:

Back-to-back advertising display, where the CAN bus is extended to manage other input sensors and output components associated with an additional LCD display;

A range of 'Smart City' products that integrate accessories such as:

Environmental monitoring e.g. by utilising the CAN Bus to communicate with $CO_2$ sensors, pollution sensors, air quality sensors, weather sensors, noise sensors, pollen sensors, etc;

Electric car charging stations e.g. by utilising the CAN Bus to communicate with payment systems, detect payment and control actuators to enable electric car charging;

Wayfinder touch screens to detail local services;

Telecommunications equipment, including smart telephone boxes;

Car park payment systems.

c) Enabling the physical design of a display to be cosmetically changed easily; such that distributed modules can be physically relocated within a housing.

d) Expandable—e.g. to add easily additional nodes/sensors on the bus.

A resilient multidrop bus provides a convenient means of locally networking intelligent Input/Output devices to a central processor; allowing a) Reduced wiring as common I/O devices share a common multiplexed bus;

b) a microcontroller to be close to an associated input sensor or output component, the microcontroller processing associated data independently from a central processor; and c) communication of digital data between distributed microcontrollers and a central processor.

CAN bus is particularly advantageous since:

It is very robust and is designed to operate in electrically noisy environments

It is hot swappable allowing I/O devices to be plugged in/out of the bus whilst powered.

It automatically manages contention of the shared bus (e.g. if two devices communicate simultaneously) in hardware, requiring no software overhead It automatically manages error correction e.g. as a result of noise, in hardware requiring not software overhead It automatically manages device identification without prior pre-programming; again reducing software overhead CAN bus is a cost-effective solution, particularly since both Physical Layer (ISO layer 1) and Data Link Layer (ISO Layer 2) (including Transfer layer and Object layer) are implemented in hardware and integrated within many low cost microcontrollers.

Data can be driven over long distances in digital displays, without error, providing ideal communication with sensor nodes distributed over a wide area.

CAN bus allows the nodes to operate autonomously such that the nodes are able to transmit messages as real-time events arise e.g. temperature exceeds a configured threshold CAN bus allows nodes to transmit messages at any time, where bus access is granted to the message with the highest priority, with automatic management of bus contention CAN Bus can automatically disconnect any faulty nodes such that it does not prevent other nodes communicating, such that the network as a whole is more fault tolerant than other multidrop or field bus protocols.

CAN Bus is expandable, to easily add additional nodes and devices on the bus.

It is worth noting that, in a conventional CAN bus implementation, when a node sends a message on the CAN bus, then all nodes receive the message—i.e. the message is broadcast to all nodes on the CAN bus. CAN bus addressing is arranged so that a node (with an identifier) transmits its data to all other nodes on the CAN Bus. There is no specific destination address specified in the CAN bus message to identify the destination node, since it operates on a peer-to-peer basis where all nodes receive messages with optional filtering implemented in CAN Bus hardware at the Object layer; so that one or more other nodes can act on the data. This allows all nodes to transmit data at the same time to other nodes that are required to act on the data, with the CAN Bus hardware managing any potential data collisions. Whilst this provides significant benefits for truly distributed processing systems e.g. automotive and industrial control; it does provide limitations and challenges for large outdoor digital displays that need to be overcome.

Large digital displays operate complex closed loop control thermal management systems that control fans/cooling systems in response to multiple heat sources including ambient light, display/backlight brightness, ambient temperatures, internal temperatures at numerous various hot and cold spot locations as well as controlling heaters to manage humidity.

Whilst native CAN Bus has the ability to enable fans to autonomously control fan speed in response to individual temperatures, it is preferred that the complex closed loop calculations are carried out centrally, and this requires a system, usually PC based to Monitor associated temperatures, humidity at multiple varied locations; as well as current fan speeds, Calculate desired fans speeds as part of a close loop system, Control the internal and external heat exchanger fans to achieve the desired internal environmental conditions.

In addition, there is also a requirement to respond quickly to exceptions and alarm conditions as they occur, such as loss of mains power, loss of video signal, reset requests (e.g. remote), door opened etc.

In order to manage numerous and distributed "slave" intelligent I/O modules from a central PC "master", it is preferred that the CAN Bus is adapted to support higher level "destination" addressing and "Command/Response" functions, currently outside the CAN Bus Data Link Layer, through a higher level data communication protocol that supports:

POLLING (MASTER/SLAVE) MODE—where the central MASTER e.g. PC polls each slave e.g. Intelligent I/O module to request and gather conditioned input data e.g. temperature and set desired output conditions e.g. fan speed.

NOTIFICATION MODE—where any slave intelligent I/O module can communicate directly with the MASTER or other devices, without waiting for the MASTER to POLL it e.g. to notify immediately upon
Loss of power
Loss of video
Door open
Remote reboot
Watchdog time out
Node boot up
Etc A standard CAN 2.0B message frame defines
A header within the protocol consisting of an Identifier (11 bits) and Identifier Extension (18 bit); which is used by a node to identify itself and associated data to all other nodes on the CAN Bus Network.
As well as associated Data fields for the communication of associated data, and
Other framing data for start of frame, end of frame, CRCs and synchronisation characters.

Whilst the standard Identifier is configured as part of the self-configuration addressing process to identify the source node (e.g. TOP Environmental Module on the front display, Internal Fan Control Module etc); the following additional information is required to be transferred within a higher level protocol within the CAN Bus message format in order to permit the Master/Slave mechanism:

Destination Address (e.g. 11 bits)—that the source node would like to transfer its data payload to
Function (e.g. 7 bits)—that it would like the destination node to carry out e.g.
COMMANDS from a MASTER node e.g. read inputs, set outputs, set configuration
RESPONSES from a specific SLAVE NODE e.g. requested input data, acknowledgement of completing the requested command, error conditions, etc
NOTIFICATIONS of alarm conditions e.g. loss of power, supervisory states e.g. node boot up The additional Destination Address and Function fields can be transferred within standard CAN Bus fields e.g.
Within the DATA fields by defining specific formats and delimiting to allow identification of destination address, function and associated data
Within and a replacement of the INDENTIFIER EXTENSION (18 bits) to transfer Destination Address and Function information Use of a bus such as a CAN Bus combined with a higher level destination addressing scheme, for example, can provide the following modes of operation.

A central electronic processor issues messages to a distributed sensing node (input) to collect (or read) data—e.g. temperature data;

A central electronic processor issues messages to a distributed control node (output) to set an output condition—e.g. set a fan speed PWM signal to a condition that controls fan speed;

Allow a distributed control node (output) to receive a message (or query) from a sensing node to control an output in response to the input. E.g. adjust fan speed autonomously and directly in response to a temperature change;

And/or allow a distributed node to send an immediate message to the electronic processor to notify an alarm condition without waiting for it to be first interrogated by the electronic processor.

That is, operation of input sensors and output components may be autonomous and/or under management of an electronic processor of a display.

Every node has the ability to detect any error in transmission e.g. as a result of noise, in which case any node can raise an error flag which destroys the bus traffic, signalling for the message to be automatically resent without any associated software overhead. As an example, temperature data sourced from multiple locations can be acted upon automatically by multiple devices e.g.

a) various active components e.g. fan controller able to adjust fan speeds automatically to maintained a desired temperature;

b) electronic processor to change operating states e.g. between cold start, warm start, power save, normal operating state, cold operation, hot operation etc;

c) electronic processor and/or other active components to adjust display brightness.

Input sensors may include a Front Facing pixel sensor to detect program on a display or a door sensor to detect if a door is open or closed.

Output components may include simple devices such as an LED indicator to show an alarm state locally; or output ports or circuits that can be configured or set to a desired state e.g. ON/OFF, PWM, Analogue level e.g. voltage level, or other signal state or condition.

The microcontroller on-board each and varied intelligent input/output module performs varied operational functions determined by its self-addressing configuration programming e.g.

Detecting its "address" from local position inputs e.g. DIP switch or cable wiring configuration
Self-configuring its operation and signal condition dependant on the "address" that is chosen at the specific location; where inputs may be wired to different sensors within the display e.g.
Front/rear LCD panel, top/bottom/centre of display panel, electronic control assembly,
Processing signals in different ways e.g. process ambient light instead of processing LCD Display Pixel light.
Process Mains power fail functionality rather than a PC watchdog timer.
Detecting applied sensors e.g.
Tilt switches
Video signal e.g. for presences or loss of video signal
Temperature
Humidity
Input mains power
Battery voltage
Fan speeds
Ambient Light Shock
Display Pixel Light (RGBc)
Energy usage e.g. meter
And potentially any input sensor applicable to the application Conditioning and processing of input signals/sensor inputs e.g.
De-bouncing "changes in state" of input sensors to record steady state values
Applying default readings (e.g. maximum or minimum settings) to sensors that are not connected or operating out of normal operation to prevent spurious conditions occurring during subsequent calculations e.g. "divide by zero"
Processing watch dog timers to ensure attached devices are operational e.g. PC
Detecting changes in state of signals for potential alarm notification purposes e.g. loss of power, loss of video signal, door open, local or remote reboot signals, module start-up/power up, where immediate action needs to be taken.

Figure 9:
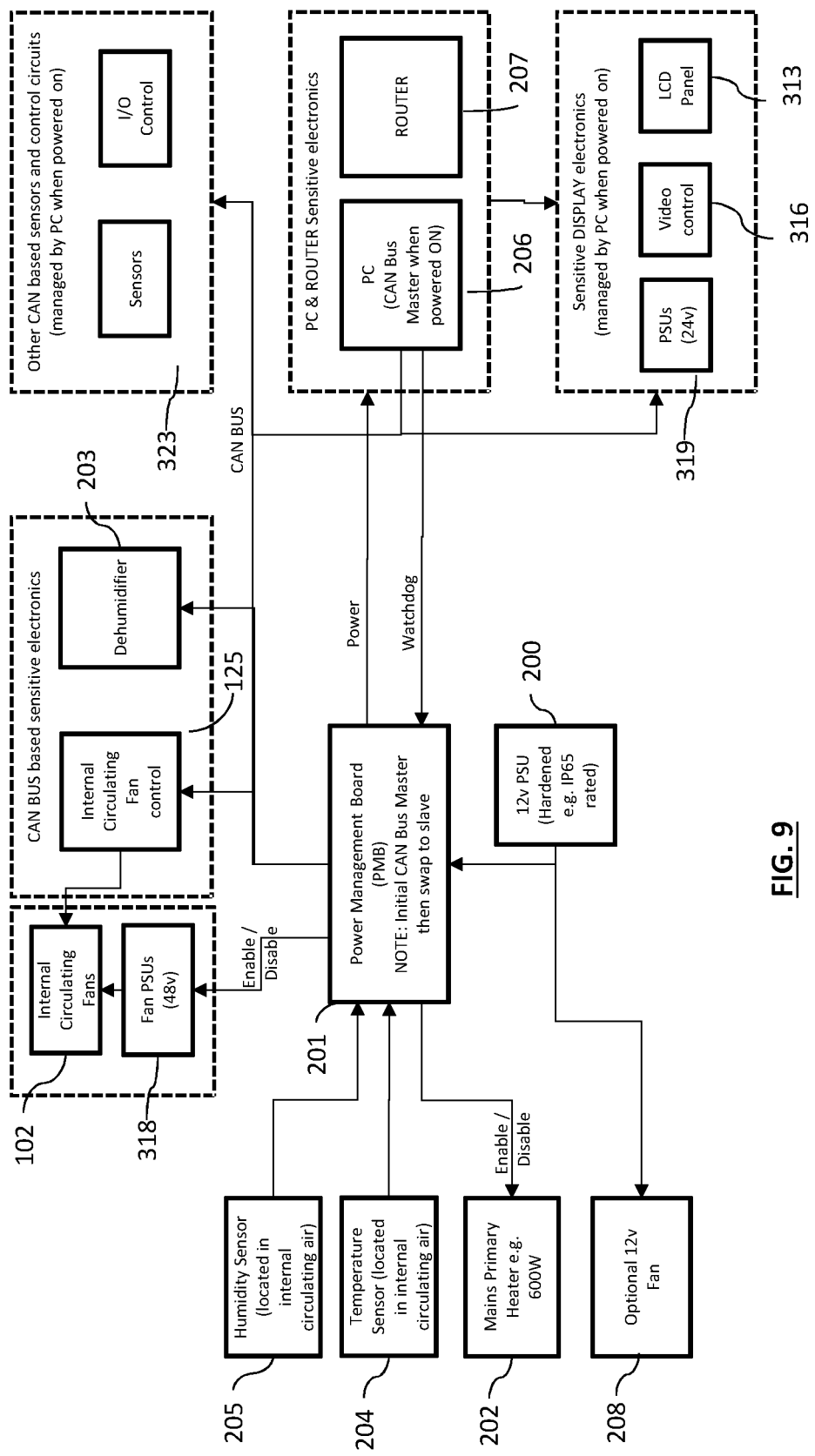
FIG. 9 is a schematic diagram of elements and components for use in the Cold Start process.

Processing of output signals for controlling actuators e.g.
Applying timers to the control of outputs such as automatically turning off outputs after a configured period e.g. turn off heater automatically after a configured period until re-instructed by PC to prevent overheating if the PC crashes.
Responding to POLLS from the MASTER (e.g. PC), through the "destination addressing layer" within the CAN BUS protocol such as
Communicating the requested "conditioned" sensor reading to the PC e.g. temperature, or
Activating an output such as turning ON a heater, under further conditioning control from the microcontroller e.g. maximum ON period before automatically turning off
Generating NOTIFICATIONS to the MASTER e.g. PC FIG. 9 illustrates elements and components for a Cold Start process in a large-scale electronic display unit.

A hardened 12 V Power Supply Unit (PSU) 200 supplies power to a Power Management Board (PMB) 201 and optionally to a fan 208 for guiding circulating air across humidity and temperature sensors. The PMB 201 receives data from one or more temperature sensor 204 and humidity sensor 205, both of which are disposed in internal circulating air. A primary heat source 202 (e.g. mains powered, 600 W) provides rapid heating of internal circulating air and is controlled by the PMB 201. Connections between the PSU 200 and the PMB 201 and optional fan 208 are direct, hardwired connections. Connections between the PMB 201 and the components 202, 204, 205 are direct, hardwired connections. A further direct, hardwired connection is made from the PMB 201 to 48V PSUs 318 for fans 102 that cause flow of internal air through an associated heat-exchanger.

The PMB 201 is also connected to a CAN bus that provides multiplexed communication for sensitive electronics such as a PC 206 and router 207; sensitive display electronics that may include 24V PSUs 319, video controller 316 and LCD panel 313; and further sensors and control circuits 323 (which may include an I/O controller).

It will be appreciated that voltage and power values that are given in this description are by way of example only. Voltage and powers other than 24 v, 48 v, 600 w may be adopted. More than one heater or heat source may be employed.

Operation of the elements and components illustrated in FIG. 9 is apparent from the preceding description and legends in the figure. It may be noted that mains powered components (12 v PSU 200, heater 202) are most at risk from condensation when power is first applied, and therefore are desirably "hardened" e.g. through sealing or conformal coating.

Lower voltage circuits (e.g. PMB 201, 12 v fan 208, sensors 204, 205 and potentially the CAN bus circuits) do not necessarily need to be "hardened", since Cold Start will usually occur infrequently and therefore any condensation we'll have a low risk of impurities. Once started, the display unit is temperature and humidity controlled to present a low risk of further condensation.

Other circuits may become increasingly sensitive to environmental conditions—e.g. PC/ROUTER 206, 207 and in particular the display electronics (e.g. LCD panel 313, video control 316).

Figure 10:
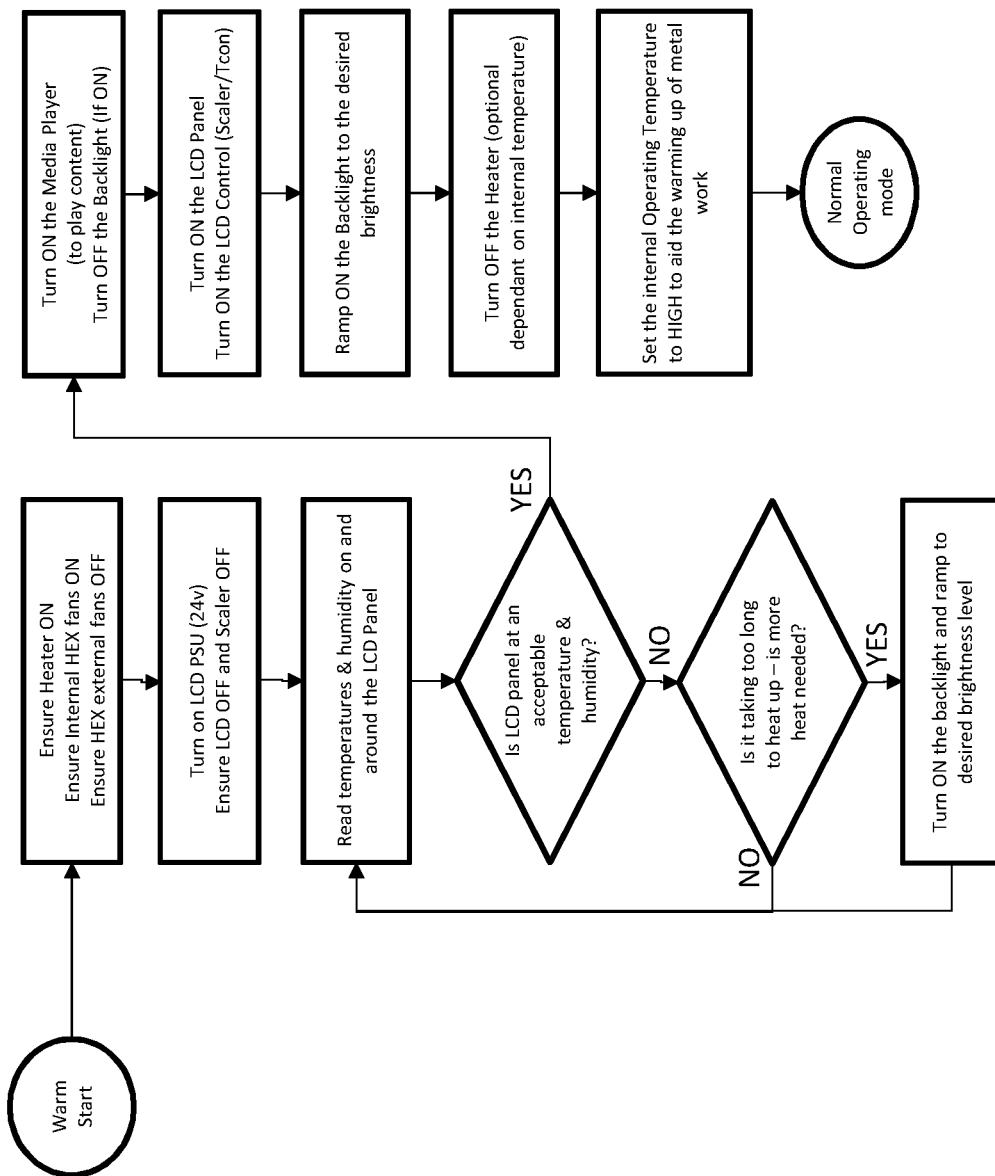
FIG. 10 is a flow chart illustrating a Warm Start process of the large-scale electronic display.

FIG. 10 illustrates a Warm Start process for a large-scale electronic display unit. The process may be understood by following the flowchart of FIG. 10.

Initially, Warm Start can be thought of as an extension to Cold Start (when the unit is first powered), where the PC takes further measures to ensure that the environmental conditions are acceptable to turn on the LCD panel (which is the most environmentally sensitive component in the system, distributed over a wide area, closer to cooler, external glass and susceptible to wider environmental temperature variations).

However, Warm Start is also entered after completing the Powersave state (which turns off the LCD panel) in order to ensure (again) that the conditions are acceptable before turning the LCD Panel back on.

Although the Powersave state will maintain a minimum internal temperature within internal circulating air, the metalwork will generally be at a lower temperature, since it is typically in thermal communication with external (ambient) cold air overnight during power save times.

The heat-exchanger fans for external air will be off when entering the Warm Start process, as there would be a risk of condensation as a result of starting the external heat-exchanger fans, which will lower internal air temperature and raise RH. Turning on the external heat-exchanger fans will have the effect of drastically dropping internal air temperature when the external heat-exchanger fans are turned on if the ambient air is cold.

There is a need to raise the heat of the unit as quickly as possible in order to reduce humidity. The initial startup temperature can be made higher than normal operational temperature to aid heating up of the metalwork by turning on the backlight as well as the heater.

Warm Start will therefore ensure that temperature on and around the LCD panel is acceptable before turning on the LCD Panel. Once the LCD panel with backlight is on, the internal temperature level will be set to HIGH (for an initial warm up period) and control passed to the Normal Operation process (detailed below), so that the Normal Operation process can raise the internal operating temperature for a period of time whilst the metalwork warms up and temperatures stabilise.

FIG. 11 is a schematic diagram of elements and components for use in controlling dew point with a crossflow heat-exchanger 100 of a large-scale electronic display unit. As seen in FIG. 11, external air flow through the heat-exchanger 100 is from right to left and internal air flow is from top to bottom.

Temperature and humidity sensors 300-311 are located in significant areas in order to manage internal temperature and to calculate dew points to manage humidity and condensation. Significant locations are:

- 304, 305—Ambient external air input at the hottest part of the heat-exchanger 100 where the associated fan 101 delivers most air flow and there is therefore the least risk of condensation. Knowing ambient air temperatures provides guidance on risk of condensation when compared to internal air temperatures.
- 308, 309—Located on metalwork of the heat-exchanger 100 in the area of most condensation risk, where the output of the internal airflow meets the input of the external airflow and where the temperature differential is lowest.
- 300-303—Input and output sides of internal air flow through heat-exchanger 100, where temperature differentials and dew points can be calculated with reference to ambient air temperatures.
- 310—Within internal circulating air paths near a controllable heat source e.g. LED backlight 312 of LCD panel 313.
- 311—One or more temperature sensor within internal circulating air flow between LCD panel 313 and solar load.
- 306-307—Output side of the external air flow from the heat-exchanger 100, to enable determination of the level of heat removed from the unit and association of temperature differentials with external ambient air input, internal air input and output to heat-exchanger 100, to help with the calculation of dew points across the heat-exchanger.

Temperature and humidity sensors need not be provided at all of the above points.

When the unit is cold, the external fans 101 are turned off, allowing the heat source 202 (and optionally 312) to pre-heat the unit to raise RH. In this case, as one alternative, the LED backlight could solely be used as the heat source without a separate, dedicated heater to raise internal temperature. Cold air is then brought into the heat-exchanger 100 to cool the unit to operating temperature and dew points calculated in the above significant areas to determine the risk of condensation. External fans are backed off if necessary, to ensure condensation cannot develop.

As the metalwork of the unit heats up, a closed loop temperature controller can regulate temperature to desired operating levels by controlling the fans 101, 102 individually for efficient heat exchange, as discussed above.

Other elements and components of the display unit include 12V PSU 200, PMB 201, controllable heat source 202, dehumidifier 203, driver 314 for LED backlight 312, sensitive control electronics 315 (e.g. PC, peripherals, router), video control electronics (e.g. scaler, timing controller), fan 317 for control electronics 315, 48V PSU 318 for fans controlled by PMB 201, 24V PSU 319 for LCD panel 313 (controlled by PMB 201), hydrophobic filter 320 (e.g. Gore vent) to aid air pressure equalisation between internal and external (ambient) air, controller 125 for individual control of internal circulating air fans 102, and controller 124 for individual control of external heat-exchanger fans 101.

FIG. 11 illustrates one example of a module 306A connected to temperature sensor 306 and provided with microcontroller 306B. Another module is in the form of external fan controller 124, provided with microcontroller 124B. Internal fan controller 125 affords a similar module. In the interests of clarity, not all modules and microcontrollers are individually shown and referenced in FIG. 11. It is possible for a given module to connect to more than one input sensor and/or output component—for example, both temperature sensor and an air fan.

Operation of the elements and components shown in FIG. 11 will be understood from the foregoing description, including the description with reference to FIGS. 1 to 6.

Figure 12:
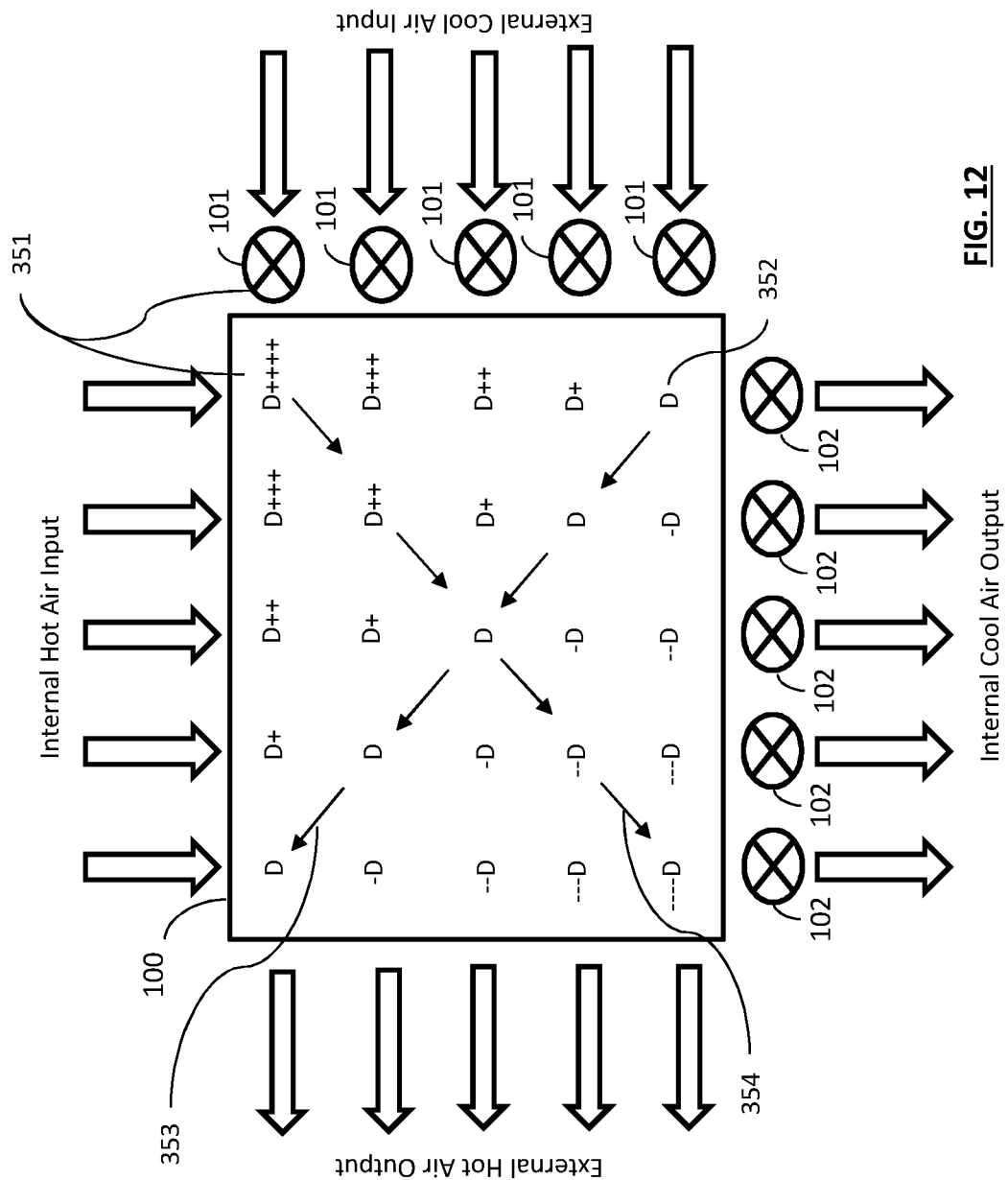
FIG. 12 is a diagrammatic view of a heat-exchanger to illustrate areas at risk of generating internal condensation.

FIG. 12 is a diagrammatic view of a heat-exchanger 100 to illustrate areas at risk of generating internal condensation. The view is similar to that of FIG. 4, the heat-exchanger 100 having horizontal channels (103) for external air and vertical channels (104) for internal air.

Top right corner 351 is the location of the heat-exchanger 100 where there is the biggest differential between internal and external air temperatures, and where there is therefore least risk of dew point condensation.

Bottom right corner 352 is the location where RH is likely to be higher in the local area around the metalwork—i.e. where coldest external air (conducted through to internal side) meets least differential between internal and external air temperatures. If this cools the air around the metalwork to dew point, then this will result in condensation.

Arrows 353 show increasing external air temperature (from bottom right to top left). Although temperature differential is substantially maintained, it does so at a higher base external air temperature, which is at less risk of condensation as RH is lower.

Arrows 354 show decreasing internal air temperature (from top right to bottom left). Although temperature differential becomes low, it is at a higher base external air temperature, which is at less risk of condensation as RH is lower.

Fans 101 and 102 are controlled individually. 351 is the location of the external fan 101 to be turned on first, where there is the biggest differential between internal and external air temperatures, and where there is least risk of dew point condensation. The external fan 101 at location 351 is also the last to be turned off.

The external fans 101 below that at location 351 are sequenced on in turn (top to bottom) at minimum speed, as risk of dew point condensation reduces. They are turned off in reverse order as cooling is reduced.

Fans 101 and 102 are preferably controlled individually, although all fans 101 could be controlled together and all fans 102 could be controlled together.

The speeds of fans 101 and 102 may be controlled to achieve efficient operation of the heat-exchanger 100, along the lines discussed above with reference to FIG. 6, for example.

Figure 13:
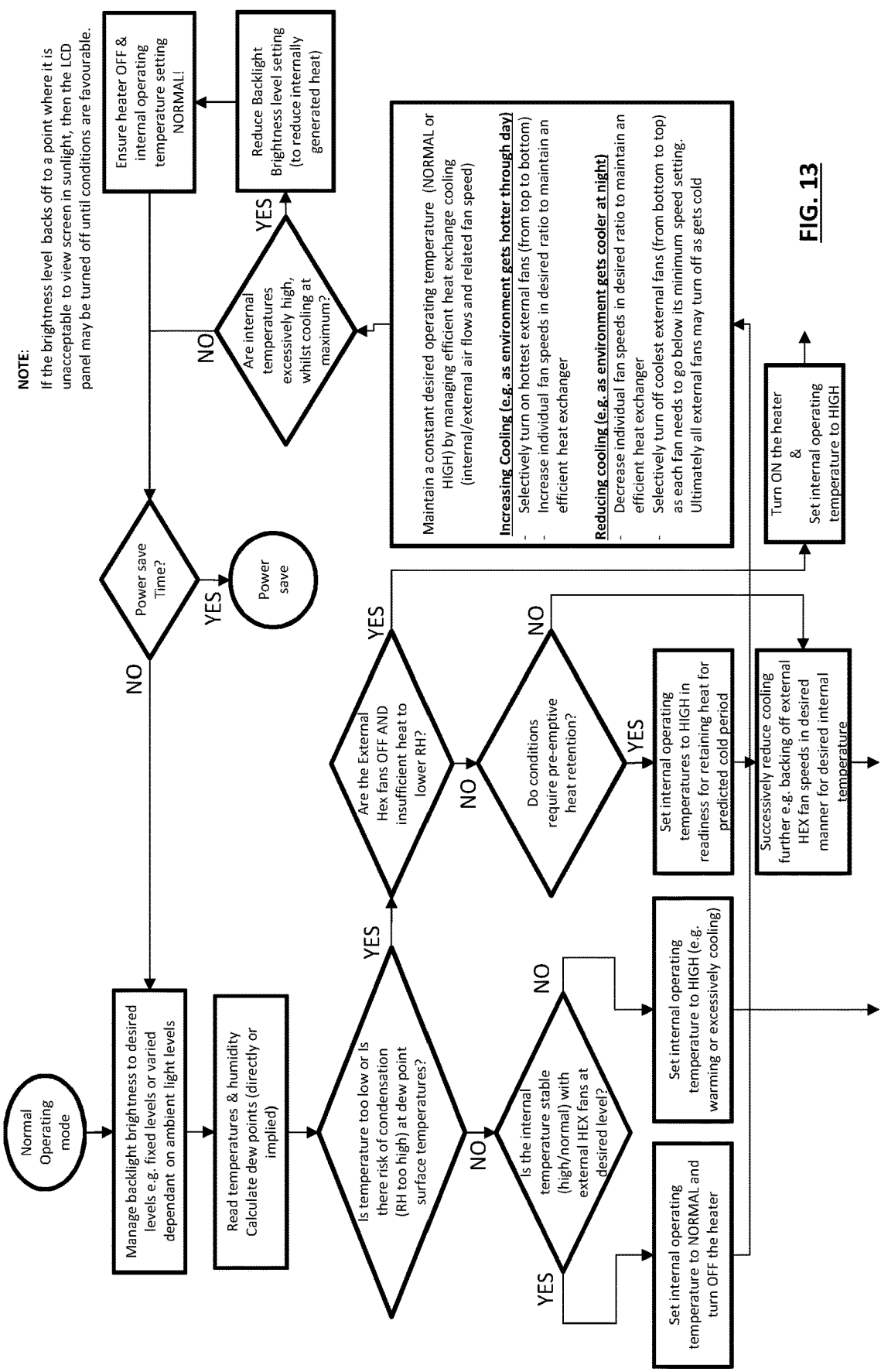
FIG. 13 is a flow chart illustrating a Normal Operation process of the large-scale electronic display.

FIG. 13 is a flowchart illustrating a Normal Operation process of a large-scale electronic display unit. The process may be understood by following the flowchart of FIG. 13.

During Warm Up, the internal operating temperature will be kept high initially, as cold air is brought into the heat-exchanger of the unit. As temperatures stabilise to provide sufficient cooling for the desired backlight brightness level (e.g. metalwork warmed up), then the internal operating temperature will be reduced to a normal operating temperature The initial startup temperature will drop quickly when cold air is initially brought in through the external fans. The external fans must be stopped (initially) or reduced as the units heat up, if dew point measurements/calculations show risk of dew point condensation.

The external fan in the hottest area of the heat-exchanger is turned on first (e.g. top right in FIG. 12) where there is the biggest temperature differential (that minimises risk of condensation). The heat-exchanger external fans are then sequenced on in turn (top to bottom at minimum speed)

If the temperature is too excessive and cannot be cooled without risk of condensation, then the level of the heat source (e.g. backlight brightness) must be reduced until an acceptable operational temperature can be reached.

As the unit begins to cool (e.g. at night) then the external heat-exchanger fan speeds will be reduced, in a ratio that allows the heat-exchanger to operate efficiently. The external air fans will turn off in turn in reverse order (to turning on)—i.e. coolest fans first.

The control element of temperature management ensures that the external heat-exchanger fans are reduced or turned off where temperature/humidity measurements (or calculations) show risk of condensation developing in the heat-exchanger.

If the backlight cannot generate a sufficiently high temperature when ambient conditions get too cold, then the dedicated heater is turned on to raise the temperature. This heater may be used to manage temperature between high and normal temperature conditions to provide hysteresis in maintaining temperature in these conditions without causing condensation issues.

Normal Operation (warming up)—The Warm Up phase can be exited when temperatures stabilise without drastic change as a result of turning on the external heat-exchanger fans; whereby the heat-exchanger fans are on at the desired levels without risk of condensation. It is worth noting that environmental conditions may be so cold that a normal operating temperature can be maintained without overheating, with the external heat-exchanger fans off—e.g. the metalwork cools the unit without the need to take in cold external air.

Normal Operation (nominal)—Under normal operating conditions, the internal operating temperature is managed to an acceptable temperature band as part of a closed loop system that adjusts the level of cooling based on the heat generated in the unit—e.g. due to brightness of the backlight and/or solar load. The higher the brightness of the backlight, the higher the cooling as a result of operating the heat-exchanger internal and external fans faster; and that tends to optimise heat-exchanger efficiency. The outdoor display will generally get increasingly warmer as the day continues e.g. as the sun reaches maximum temperatures. The temperature management system will adjust external heat-exchanger fans (and internal fans) accordingly to maintain a desired operating temperature Normal operation (Hot)—if insufficient cooling can be achieved to operate the electronics of the unit within specification then, for example, the backlight brightness is gradually reduced. Under worst case conditions, all heat sources are turned off until satisfactory nominal operating conditions arise. If temperature is excessively high then there is no/very little risk of condensation.

Normal Operation (Cooling)—As the environment gets colder, e.g. at dusk or night time, the heat-exchanger fans are successively reduced in speed at an appropriate ratio (for an efficient heat-exchanger operation). Then external air fans are successively turned off (from bottom to top) such that the fans most at risk of causing condensation (least differential) are turned off first. As the units get cooler, provision is made to retain heat over the cooler period (before all external fans turned off) by operating at a higher internal temperature (e.g. similar to warming up) by reducing the external air flow further, to keep RH as low as possible when the external fans are finally fully turned off. This may keep the unit as warm as possible before entering Powersave mode, which will reduce the need to turn the heater back on in Powersave. If there is insufficient heat to lower RH for the desired backlight brightness (or temperature falls too low), then the unit will turn on the dedicated heater to increase heat and reduce RH to desired levels—particularly since it is not desirable to raise backlight brightness to generate heat when ambient light levels are low. Furthermore, local regulations may set a maximum light level that outdoor screens can operate at between dusk and dawn in order to minimise light pollution. In this case the dedicated heater may be turned on or off to manage temperatures in these conditions between high and normal levels.

Figure 14:
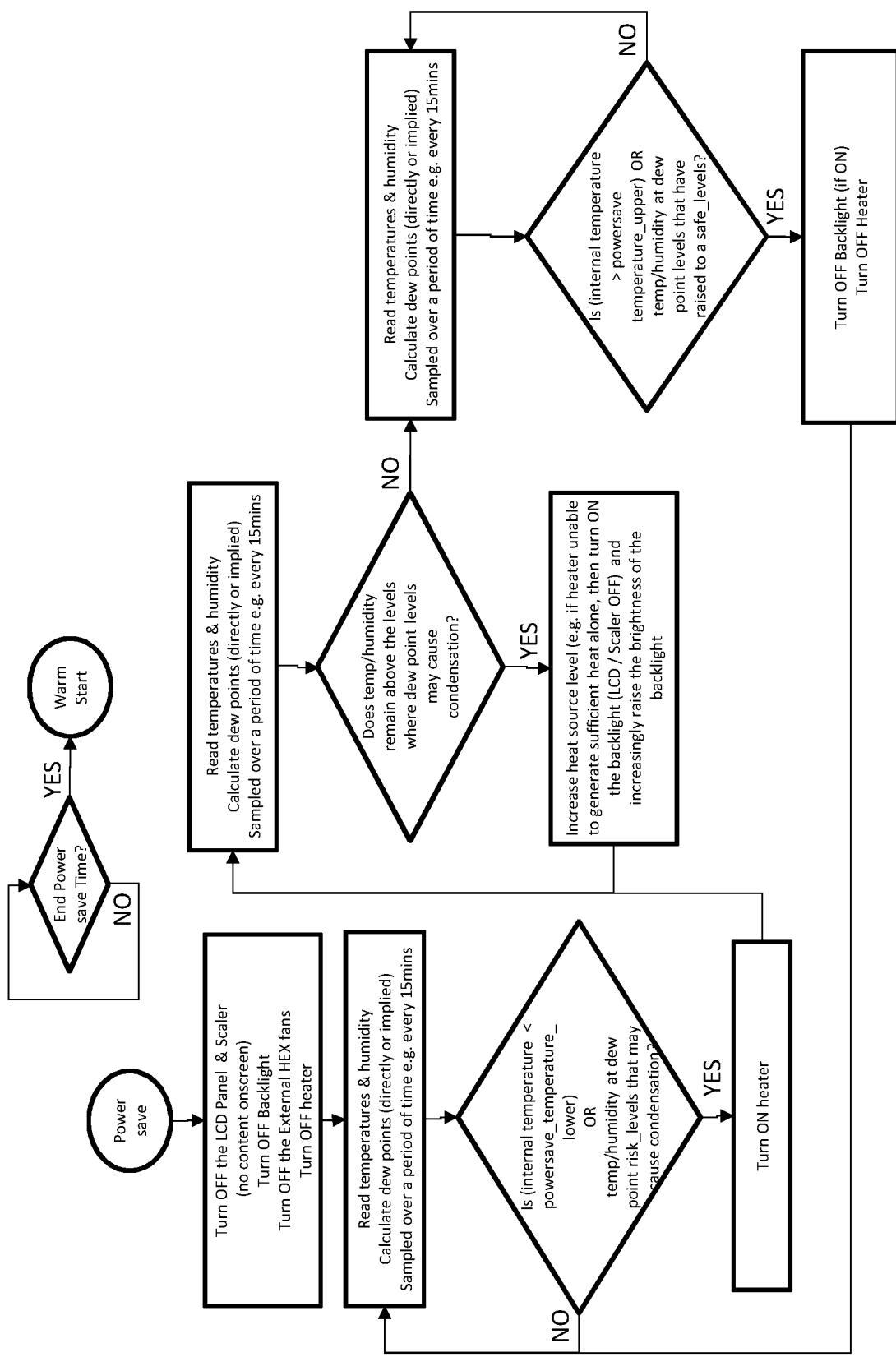
FIG. 14 is a flow chart illustrating a Powersave process of the large-scale electronic display.

FIG. 14 is a flowchart illustrating a Powersave process of a large-scale electronic display unit. The process may be understood by following the flowchart of FIG. 14.

Powersave mode is typically entered at a desired time of day setting (e.g. 2.00 am), when normal operation is not required e.g. outside advertising times. It is desirable to maintain a minimum temperature band within the unit to ensure sensitive electronics maintain operation; and where there is no risk of condensation by temperature/humidity reaching dew points on internal surfaces.

Under risk conditions, the dedicated heater is turned on to increase temperature, reduce RH and raise the dew point. If the heater is not able to generate enough heat over a period of time, then the backlight can be turned on and the brightness gradually increased until temperature, RH & dew points are at acceptable levels. As an alternative, the LED backlight can be used alone to raise temperature without use of a dedicated heater; where the LCD panel is turned off so that content is not displayed.

Once safe levels have been reached then the heat source (backlight and heater) can be reduced/turned off and the process repeated until time settings (or when instructed) exit from the Powersave mode. The unit must then go into Warm Start mode in readiness for full operation.

Hysteris is therefore required to permit the heating and cooling to occur over an acceptable band in order to manage temperature and RH to acceptable levels. Internal temperature remains above minimum conditions so that condensation does not cause long term issues with low voltage non-hardened electronics.

Powersave may be exited early in the morning when external temperatures are cold. Cold external air is in thermal communication with the internal metalwork. Therefore, although internal air temperature may become warm, metalwork will likely be at a much lower temperature. Care therefore has to be taken before entering Normal Operation mode to ensure that cold air brought into the unit does not cause internal condensation—hence the need to exit to the Warm Start mode first.

The term PC is used frequently in the art of digital displays and is used conveniently in this specification to denote any suitable data processor. More than one PC may be provided, each for controlling different functions within the display.

It may be noted that humidity measurements may be accurate only where the temperature is above 0° C., as frozen water (solid) returns to a liquid state. Likewise, dehumidifier operation can only take place above 0° C. when frozen water (solid) has returned to a liquid state. Where temperature is at or below 0° C. then humidity is assumed to be 100% e.g. for the purpose of calculating Dew Point Temperature.

Humidity sensors typically have a built-in temperature sensor, so whenever a humidity reading is taken (relative or otherwise), it may be taken relative to the temperature in the same location. Thus, all humidity readings from sensors may be recorded at the same time and location as associated temperature readings from the sensors, in order to determine the humidity relative to temperature (i.e. "Relative Humidity") for the purpose of calculating dew point.

Whilst LCD display panels, typically with LED backlights, are disclosed in this specification, electronic display panels of other types may alternatively be employed, where practical—for example, LED or plasma display panels—or oLED display panels (which do not necessarily require a backlight). Where an electronic display panel requires a backlight, the term 'display panel' is to be understood to include such a backlight, unless the context requires otherwise.

In this specification, the verb "comprise" has its normal dictionary meaning, to denote non-exclusive inclusion. That is, use of the word "comprise" (or any of its derivatives) to include one feature or more, does not exclude the possibility of also including further features. The word "preferable" (or any of its derivatives) indicates one feature or more that is preferred but not essential.

All or any of the features disclosed in this specification (including any accompanying claims, abstract and drawings), and/or all or any of the steps of any method or process so disclosed, may be combined in any combination, except combinations where at least some of such features and/or steps are mutually exclusive.

Each feature disclosed in this specification (including any accompanying claims, abstract and drawings), may be replaced by alternative features serving the same, equivalent or similar purpose, unless expressly stated otherwise. Thus, unless expressly stated otherwise, each feature disclosed is one example only of a generic series of equivalent or similar features.

The invention is not restricted to the details of the foregoing embodiment(s). The invention extends to any novel one, or any novel combination, of the features disclosed in this specification (including any accompanying claims, abstract and drawings), or to any novel one, or any novel combination, of the steps of any method or process so disclosed.

The invention claimed is:

1. A crossflow heat-exchanger comprising:
a first set and a second set of fluid-flow channels arranged such that each of the first set and second set crosses the other to afford heat-exchange between a first fluid in the first set and a second fluid in the second set, without the first fluid contacting the second fluid;
a first impelling means arranged to cause the first fluid to flow through the first set;
a second impelling means arranged to cause the second fluid to flow through the second set;
a first controller for the first impelling means and arranged, in use, to control the flow of the first fluid through the first set such that the first fluid flows through different channels of the first set at different rates; and
a second controller for the second impelling means and arranged, in use, to control the flow of the second fluid through the second set such that the second fluid flows through different channels of the second set at different rates.

2. The crossflow heat-exchanger according to claim 1 wherein, in use, at least one of (a) the different rates of the flow of the first fluid in the different channels of the first set decrease from one side of the first set to an opposite side of the first set or (b) the different rates of the flow of the second fluid in the different channels of the second set decrease from one side of the second set to an opposite side of the second set.

3. The crossflow heat-exchanger according to claim 2, wherein at least one of (a) said one side of the first set is adjacent a fluid input to the second set or (b) said one side of the second set is adjacent a fluid input to the first set.

4. The crossflow heat-exchanger according to claim 1, wherein at least one of (a) said first impelling means is disposed at an output side of the first set or (b) said second impelling means is disposed at an output side of the second set.

5. The crossflow heat-exchanger according to claim 1, wherein at least one of (a) said first impelling means comprises a plurality of impellers for the first set or (b) said second impelling means comprises a plurality of impellers for the second set.

6. The crossflow heat-exchanger according to claim 5, wherein (a) the first controller is arranged to control at least one speed of the impellers of the first impelling means, to control the different rate of the flow of the first fluid and (b) the second controller is arranged to control at least one speed of the different impellers of the second impelling means, to control the different rate of the flow of the second fluid.

7. The crossflow heat-exchanger according to claim 5, wherein at least one of (a) said first impelling means comprises a respective one of the impellers of the first impelling means for each channel of the first set or (b) said second impelling means comprises a respective one of the impellers of the second impelling means for each channel of the second set.

8. The crossflow heat-exchanger according to claim 5, wherein each impeller for the first set is individually controlled by the first controller; and each impeller for the second set is individually controlled by the second controller.

9. The crossflow heat-exchanger according to claim 1, wherein at least one of:
(a) said first impelling means comprises at least one impeller of said first impelling means arranged to impel the first fluid through said first set of fluid-flow channels; and the first controller comprises one or more first controllable restrictor arranged to restrict the flow of the first fluid through said first set of fluid-flow channels; or
(b) said second impelling means comprises at least one impeller of said second impelling means arranged to impel the second fluid through said second set of fluid-flow channels; and the second controller comprises one or more second controllable restrictor arranged to restrict the flow of the second fluid through said second set of fluid-flow channels.

10. The crossflow heat-exchanger according to claim 1, wherein at least one of (a) said first controller responds to temperature sensors on or adjacent to the first set or (b) said second controller responds to temperature sensors on or adjacent to the second set.

11. The crossflow heat-exchanger according to claim 1, wherein said first and second sets of fluid-flow channels cross one another substantially at right angles.

12. The crossflow heat-exchanger according to claim 1, wherein at least one of (a) said first controller controls the flow of the first fluid through the first set or (b) said second controller controls the flow of the second fluid through the second set to tend to maximise temperature differentials between the first and second fluids, at or around intersection points of said first and second set.

13. The crossflow heat-exchanger according to claim 1, disposed within a housing in which one of the first and second fluids circulates, and another of the first and second fluids is introduced from outside the housing.

14. The crossflow heat-exchanger according to claim 1, arranged to operate with gases as said first and second fluids.

15. An electronic display comprising a crossflow heat-exchanger according to claim 14, wherein said gases comprise internal air and external air and the crossflow heat-exchanger is arranged to provide cooling of the internal air circulating within the housing by the external air introduced from outside the housing.

16. The electronic display according to claim 15, being a large-scale electronic display.

17. An electronic apparatus comprising a crossflow heat exchanger according to claim 1, the apparatus comprising a housing and, disposed within the housing:
a power supply unit arranged, in use, to receive electrical power from an external source and supply the electrical power to components of the electronic apparatus;
a power controller arranged, in use, to control the power supply unit;
a heat source;
a temperature sensing means;
a humidity sensing means; and
an electronic processor arranged, in use, to receive electrical power from the power supply unit and to carry out functions of the electronic apparatus:
wherein, upon startup of the electronic apparatus, the power controller is arranged to:
receive temperature and humidity data from the temperature and humidity sensing means;
process the received temperature and humidity data to indicate a current dew point within the housing;
compare the current dew point with a current location temperature at a location within the housing;
if the current location temperature is at or below the current dew point, activate the heat source to raise the temperature within the housing; and
only if the current location temperature is above the current dew point, supply the electrical power from the power supply unit to the electronic processor.

18. The electronic apparatus according to claim 17, further comprising a dehumidifier, wherein the electronic processor is arranged to control the dehumidifier in order to adjust the dew point within the housing.

19. The electronic apparatus according to claim 17 wherein, in use, after the power controller has supplied the electrical power to the electronic processor, the electronic processor takes over the monitoring of the temperature and humidity data from the temperature sensing means and the humidity sensing means and controls operation of the heat source, and dehumidifier if present, in response to the monitored temperature and humidity data.

20. The electronic apparatus according to claim 17, wherein the power controller is hardened to be resistant to moisture.

21. An electronic apparatus comprising a crossflow heat-exchanger according to claim 13 and, disposed within the housing:
said crossflow heat-exchanger arranged, in use, to receive said another of the first and second fluids from the outside of the housing and output said another of the first and second fluids to the outside of the housing;
a heat source;
a temperature sensing means;
a humidity sensing means; and
a controller arranged to:
receive temperature and humidity data from the temperature and humidity sensing means;
process the received temperature and humidity data to indicate a current dew point within the housing;
compare the current dew point with a current location temperature at a location within the housing; and
if the current location temperature is at or below the current dew point, to perform at least one of (a) controlling the flow of the first and second fluids through the crossflow heat-exchanger to raise the temperature at least one location on the crossflow heat-exchanger and (b) activating the heat source to raise the temperature within the housing.

22. An electronic display comprising a heat-exchanger according to claim 13, wherein:
the housing is divided internally into regions;
a display panel is disposed within one of said regions and has a display surface that is visible through the housing;
the crossflow heat exchanger comprises a cooling module disposed within the housing and arranged to provide a flow of internal coolant through the cooling module and said regions, said internal coolant being said one of said first and second fluids;
each of said regions has a region internal coolant inlet and a region internal coolant outlet;
said cooling module has a cooling module internal coolant inlet and a cooling module internal coolant outlet;
the region internal coolant inlet of each of said regions communicate with the cooling module internal coolant outlet and the region internal coolant outlets of each of said regions communicate with the cooling module internal coolant inlet;
the arrangement is such that, in use, each of said regions has its own circulating loop of internal coolant, through a respective one of said regions and the cooling module; and
the flow of internal coolant passes over both a front and a back of the display panel.

23. The electronic display according to claim 22, wherein the cooling module has side walls that extend between side walls of the housing.

24. The electronic display according to claim 23, wherein the side walls of the cooling module divide the housing into said regions.

25. The electronic display according to claim 22, wherein the cooling module internal coolant inlet and cooling module internal coolant outlet face and are spaced from side walls of the housing.

26. An electronic display comprising the crossflow heat-exchanger according to claim 13, and further comprising:
a display having a display panel, the display panel within the housing and having a display surface that is visible through the housing;
an electronic processor arranged to control functions of the display and operating conditions within the housing;
input sensors disposed within the housing at distributed locations and arranged to sense operating conditions within the housing;
output components disposed within the housing at distributed locations and arranged to respond to control signals; and
a bus connecting said input sensors, said output components and said electronic processor for intercommunication;

wherein, in use, processing of signals received from said input sensors and control signals passed to the output components is distributed amongst microcontrollers that are local to said input sensors and output components and connect said input sensors and said output components to said bus.

27. The electronic display according to claim 26, wherein said operating conditions comprise environmental conditions.

28. The electronic display according to claim 27, wherein said input sensors comprise humidity sensors and temperature sensors.

29. The electronic display according to claim 26, wherein said output components are operative to adjust environmental conditions.

30. A method of operating a crossflow heat-exchanger according to claim 1, comprising the steps of causing the flow of the first and second fluids through the first and second sets of channels and controlling the flow of fluid through the channels such that the fluid flows through the different channels at the different rates.

* * * * *